United States Patent
Kodama et al.

(10) Patent No.: US 7,875,902 B2
(45) Date of Patent: Jan. 25, 2011

(54) ELECTRO-STATIC DISCHARGE PROTECTION DEVICE

(75) Inventors: Noriyuki Kodama, Kawasaki (JP); Koichi Sawahata, Kawasaki (JP)

(73) Assignee: Renesas Electronics Corporation, Kawasaki (JP)

( * ) Notice: Subject to any disclaimer, the term of this patent is extended or adjusted under 35 U.S.C. 154(b) by 314 days.

(21) Appl. No.: 11/947,433

(22) Filed: Nov. 29, 2007

(65) Prior Publication Data

US 2008/0277689 A1    Nov. 13, 2008

Related U.S. Application Data

(62) Division of application No. 10/728,379, filed on Dec. 3, 2003, now Pat. No. 7,332,748.

(30) Foreign Application Priority Data

Apr. 12, 2002 (JP) ............... 2002-353133
Aug. 25, 2003 (JP) ............... 2003-300422

(51) Int. Cl.
*H01L 29/74* (2006.01)
(52) U.S. Cl. .............. 257/107; 257/111; 257/358; 257/355
(58) Field of Classification Search ........... 257/107, 257/111, 358, 355
See application file for complete search history.

(56) References Cited

U.S. PATENT DOCUMENTS

| 4,939,616 A | 7/1990 | Rountree |
| 5,012,317 A | 4/1991 | Rountree |
| 5,225,702 A | 7/1993 | Chatterjee |

(Continued)

FOREIGN PATENT DOCUMENTS

JP    09107074    4/1997

(Continued)

OTHER PUBLICATIONS

Amerasekera, et al., "Substrate Triggering and Salicide Effects on ESD Performance and Protection Circuit Design in Deep Submicron CMOS Processes" 1995 IEEE, pp. 547-549, 0-7803-2700-4.

(Continued)

*Primary Examiner*—Long Pham
(74) *Attorney, Agent, or Firm*—Katten Muchin Rosenman LLP

(57) ABSTRACT

An electro-static discharge protection device includes a first conductive type well and a second conductive type well which are formed in a surface of the first conductive type layer or a first conductive type substrate. A first high concentration second conductive type region, a first high concentration first conductive type region, and a second high concentration second conductive type region are formed in a surface of the second conductive type well. A third high concentration second conductive type region is formed in a surface of the first conductive type well. The first high concentration second conductive type region and the first high concentration first conductive type region are connected with a first power supply of a potential. The third high concentration second conductive type region is connected with a second power supply having a potential different from the potential of the first power supply. The second high concentration second conductive type region is set to a potential different from the first power supply.

4 Claims, 30 Drawing Sheets

U.S. PATENT DOCUMENTS

| | | | |
|---|---|---|---|
| 5,465,189 | A | 11/1995 | Polgreen et al. |
| 5,502,317 | A | 3/1996 | Duvvury |
| 7,332,748 | B2 * | 2/2008 | Kodama et al. ............. 257/107 |
| 2002/0130366 | A1 | 9/2002 | Morishita |
| 2002/0153571 | A1 | 10/2002 | Mergens et al. |
| 2003/0075726 | A1 | 4/2003 | Ker et al. |

FOREIGN PATENT DOCUMENTS

| | | |
|---|---|---|
| JP | 2003203985 | 7/2003 |

OTHER PUBLICATIONS

Mergens, et al., "High Holding Current SCRS (HHI-SCR) for ESD Protection and Latch-Up Immune IC Operation" 2002 EOS/ESD Symposium, pp. 1-8.

Chatterjee, et al., "A Low-Voltage Triggering SCR for On-Chip ESD Protection at Output and Input Pads" IEEE Electron Device Letters, vol. 12, No. 1, Jan. 1991 IEEE pp. 21-22.

* cited by examiner

ELECTRO-STATIC DISCHARGE PROTECTION DEVICE

BACKGROUND OF THE INVENTION

1. Field of the Invention

The present invention relates to an electro-static discharge (ESD) protection device which is provided on a chip to protect an internal circuit from electro-static discharge, and more particularly to a silicon controlled Rectifier type) SCR-type ESD protection device to achieve high-speed turn-on operation.

2. Description of the Related Art

The recent complex and high density design of semiconductor devices is bringing about such a problem that semiconductor devices are damaged by electrostatic discharge (ESD) during an assembling process or the like in the fabrication process. As one measure against the problem, an on-chip electrostatic discharge protection device (hereinafter also called "ESD protection device"), which protects elements in an internal circuit by efficiently discharging an electrostatic discharge current in a safe path, is provided in the chip of a semiconductor device. Especially, a CMOS transistor is sensitive remarkably to the electro-static discharge, because a gate oxide film is very thin so that the breakdown voltage of the gate oxide film decreased. In other words, the difference between a breakdown voltage of the gate oxide film and a trigger voltage, namely a voltage that the electro-static discharge protection device begins to become low impedance, becomes small. Therefore, there is a high possibility that a voltage above a permissive level is applied to the gate oxide film and the internal circuit is destroyed, when a great deal of currents flow. Thus, it is required for the recent electro-static discharge protection device to decrease the trigger voltage as the breakdown voltage of the gate oxide film has decreased.

Generally, an input circuit of a CMOS transistor circuit for a high-speed operation needs short RC delay and the RC delay should be short even if the ESD protection is added. Thus, a protection resistance element with a large resistance value cannot be used while it is widely used. Also, it is required that a layout area of the protection device is small from the viewpoint of manufacturing cost in addition of capacity delay.

An SCR, which can satisfy the above requests, is generally used as an ESD protection device because the SCR has the excellent advantages of a low capacity, a very low holding voltage and a small layout area, compared with other protection devices. The SCR-type ESD protection device is disclosed in U.S. Pat. Nos. 5,225,702, 5,465,189 and 5,502,317 (first to third conventional examples) and "A low-voltage triggering SCR (silicon controlled rectifier) for on-chip ESD protection ato output and input pads", (IEEE electron Device Letters, Vol. 12, the No. 1, pp. 21-22, January 1991) (fourth conventional example) by Chatterjee A. et al.

FIG. 1 is a plan view showing the layout of a low voltage trigger SCR in the ESD protection device of the first conventional example, and FIG. 2 is a cross sectional view of the ESD protection device of FIG. 1 along the A-A line. As shown in FIGS. 1 and 2, in the ESD protection device of the first conventional example, a first P-well $3a$ and an N-well 2 and a second P-well $3b$ are formed in the surface of a $P^+$ semiconductor substrate 1. A $P^+$ region 4 functioning as an anode of the SCR and a $N^+$ region 5 functioning as an N-well pick-up region thereof are formed in the regions of the N-well 2 partitioned by the device separation isolation regions 6. A pair of the $N^+$ regions 9 is formed for the source and drain of a NMOS transistor in the P-well $3b$ adjacent to the N-well 2. A gate electrode 8 is formed above the substrate between the $N^+$ regions 9. Also, of the $N^+$ regions 9 of the NMOS transistor, a drain region (the $N^+$ region 9 on the side of the $P^+$ region 4) is connected with the N-well 2, and the source region (the $N^+$ region 9 on the opposite side) functions as the cathode of the SCR.

An input pad together with the $N^+$ region 5 as the N-well pick-up region is connected with the $P^+$ region 4 in the N-well 2, and the $N^+$ region 5 as the N-well pick-up region is connected with a power supply potential Vdd. Also, a ground pad is connected with the $N^+$ region 9 functioning as the cathode of the SCR. It should be noted that the reference numeral 7 denotes a latch-up prevention $P^+$ region, and is grounded and functions as a guard ring. In the figure, only a part of the guard ring is shown.

When a positive electro-static over voltage is applied to the input pad connected with the SCR, avalanche breakdown occurs in the PN junction of the side of the drain of the NMOS transistor, and the MOS transistor begins to generate electron-hole pars. As a result, the substrate current, that is the hole current, flows toward the P+ guard ring, and the substrate potential, that is the local electric potential near the device, rises. For this reason, the electric potential at the bottom of the cathode of the SCR, i.e., the source of the NMOS transistor rises and the $N^+$/P-well diode is biased in a forward direction so that the lateral-type NPN (L-NPN) bipolar device 11 is set to a conductive state. Also, the current flows through the N-well 2 to generate the potential difference in the N-well 2. When the potential at the bottom of the anode of the SCR, i.e., the $P^+$ region 4 in the N-well 2 decreases lower than the potential of the $N^+$ region 5 as the N-well pick-up region, and the $P^+$/N-well diode is biased in a forward direction. Thus, a vertical-type PNP (V-PNP) bipolar device 12 turns on.

Because the V-PNP bipolar device 12 supplies current toward the substrate, which is then fed back to the base of the L-NPN transistor 11, thereby amplifying the base current of the L-NPN transistor. Therefore, the SCR is set to the operation state within a time of less than one nano second. This forms a low-resistance current path between the anode (the $P^+$ region 4) and the cathode (the $N^+$ region 9).

The SCR of the first conventional example is called a low voltage trigger SCR (LVTSCR), but besides, various types of SCRs to be described below exist and those characteristics are shown in FIG. 7.

Also, Japanese Laid Open Patent Application (JP-A-Heisei 09-107074: a fifth conventional example) discloses an ESD protection integrated circuit using a substrate trigger L-NPN transistor.

FIG. 3 is a plan view showing a layout of the ESD protection device of the fifth conventional example, and FIG. 4 is a cross sectional view of the ESD protection device along the B-B line of FIG. 3. In this ESD protection device, a $P^+$ region 10 as a trigger tap is provided directly in the second P-well $3b$ instead of the NMOS transistor. The substrate potential rises through a triggering current supplied from the $P^+$ region 10. In this conventional example, an N-type MOSFET is used as a circuit for supplying a substrate current, and a circuit connecting the source and the $P^+$ region functions as a substrate bias circuit.

In addition to these conventional examples, US Laid Open Patent Application (2003/0075726: sixth conventional example), Japanese Laid Open Patent Application (JP-P2003-203985A: seventh conventional example), U.S. Pat. No. 5,225,702 (eighth conventional example) are known as the method for supplying the current to the N-well as for the trigger method of the SCR.

Moreover, as shown in FIG. 10, in the sixth conventional example, triggering taps are arranged between the anode and the cathode, and currents are supplied to the respective trigger electrodes to achieve a high-speed trigger operation. This is called as a double trigger-SCR.

In the seventh conventional example, as shown in FIG. 9, a trigger device is connected with a diode between the anode 4 and the N-well pick-up region 5 in the N-well. When the trigger device is turned on, a current flow through the diode in the N-well and then the V-PNP bipolar transistor is turned to trigger the SCR. This type of SCR is called as a V-PNP triggered SCR.

Main concern in the industry about using SCRs as ESD protection devices is unintentional latch-up during normal operating conditions, that is, an uncontrolled triggering of SCR during normal operation, such as the system noise. One method to avoid latch-up risk in the SCR ESD protection devices is to adjust the holding voltage to keep above the supply voltage, including some safety margin. Such SCRs are described in U.S. Pat. Nos. 5,012,317 (ninth conventional example) and 4,939,616 (tenth conventional example), and in (2002/0153571: eleventh conventional example).

As shown in FIG. 8, resistance elements are added to the substrate or an N-well to increase the holding voltage. However, in order to make it possible to adjust the holding voltage by the external resistance elements, it is necessary to decrease the N-well resistance and the P-well resistance of the SCR structure sufficiently in this circuit structure. However, this is also difficult in the SCR which uses a high resistance substrate and/or STI(shallow trench isolation). In view of this point, a layout in which the P-well effective resistance and the N-well effective resistance can be decreased is described in the eleventh conventional example and in "High Holding Current SCRs (HHI-SCR) for ESD Protection and Latch-up Immune for IC Operation", (Electrical Overstress/Electrostatic Discharge Symposium Proceedings 2002 (1A.3.1): twelfth conventional example) by Marcus P. J. Mergens, and Christian C. Russ, et. al, and US Patent Publication (2003/0218841; thirteenth conventional example), which was filed by the inventors of the present invention.

FIG. 5 is a plan view showing a layout of SCR described in the tenth conventional example (This SCR is called as HHI-SCR (High Holding Current-SCR). FIG. 6A is a cross sectional view of the SCR along the C-C line of FIG. 5, and FIG. 6B is a cross sectional view of the SCR along the D-D line of FIG. 5. As shown in FIGS. 5, 6A and 6B, each of the anode and the cathode of the SCR is divided into a plurality of regions and an N-well voltage control $N^+$ region and a P-well voltage control $P^+$ region are inserted between the regions. A triggering current is supplied to the $P^+$ region between the cathode regions. FIG. 11 shows a cross sectional view of the SCR corrected to a usual layout to describe a circuit operation. The resistance element of 2 to 10Ω is connected between the P-well voltage control $P^+$ region and the ground potential. The N-well resistance is controlled by changing the external resistance element value, and the number of connections between the N-well voltage control $N^+$ region s in the N-well and the input terminals. The holding voltage can be adjusted through the control of the N-well resistance. While the SCR carries out the trigger operation, the triggering current is supplied to the parallel circuit of the resistance element, and the PN diode (containing P-well resistance) between the P-well voltage control $P^+$ region and the cathode. Because the resistance value of the PN diode is very high generally, a clamp voltage is determined based on the resistance element between the P-well voltage control $P^+$ region and the ground potential. This resistance value is set previously to a low value. These facts would be understood from FIG. 7 showing the characteristic of the SCR.

In this SCR, an NMOS is used as the trigger device. The trigger device discharges a current until the SCR becomes low resistance, and the I-V characteristic is similar to that of the NMOS. Therefore, both of the triggering current and the holding current are set to a very higher value of 100 to 500 mA in the holding voltage adjustable SCR than the usual SCR. As shown in FIG. 12, in the tenth conventional example, two trigger devices are connected with the N-well voltage control $N^+$ region and the P-well voltage control $P^+$ region, respectively. The triggering current is supplied to each of resistance elements from the corresponding trigger circuit to trigger the SCR at two points.

However, there are problems as shown below in the above-mentioned conventional examples.

The conventional SCR type ESD protection device in the conventional examples 1 to 7 has the following problems. As the miniaturization of the CMOS-LSIs gain pace so the gate oxide film needs to become thinner. This lowers the breakdown voltage of the gate oxide film so that the gate oxide film is very susceptible to ESD. As reported by J. Wu et al. in "Breakdown and latent damage of ultra-thin gate oxides under ESD stress conditions", Electrical Overstress/Electrostatic Discharge Symposium Proceedings 2000, p. 287-295, for example, the conventional system called a low-voltage trigger SCR takes time for the SCR to have a low resistance after it is turned on. This results in the overshooting of the voltage before the SCR is turned on, in which case the internal circuit may not be protected. The conventional examples 1 to 7 employ larger spacing between the anode and the cathode to adjust the holding voltage to an acceptable voltage, resulting in facing a severe problem of voltage overshooting.

In a process using a high resistance substrate, the triggering current is as very low as 1 to a few ten mA, and the triggering voltage is almost not affected even if the resistance value of the trigger device or a path through which the triggering current flows is high. However, because the holding voltage is as very low as about 1 V, there is a risk that the SCR is latched up through the usual operation. Therefore, such an SCR may be applicable only if diodes are connected in series to increase the total holding voltage.

In an SCR using a low resistance substrate, the distance between anode and the cathode is made wide to increase the holding voltage or a special layout is used like the tenth and eleventh conventional examples. In the SCR with the holding voltage set high, the triggering current necessarily increases greatly in case of use of the conventional methods. In this case, the triggering current is in a range of 100 mA to 1 A typically. Surge current is discharged through the trigger device until the SCR is turned on. When the resistance value of the current path is high, there is a possibility that the triggering voltage becomes very high, so that the protected circuit cannot be protected because of over-voltage, as shown in FIG. 7. For example, in the SCR described in the first to fourth conventional examples, the resistance of the current path through which the triggering current flows, e.g., the resistance of the $P^+$/N-well diode cannot be decreased in many cases under the restraint of the layout.

However, this resistance value becomes a problem actually. In a method employed in the tenth eleventh conventional example, and in the twelfth conventional example, the trigger current is shunted by the external resistance element, as low as 2 ohm, to lower the triggering voltage.

Also, considering from the viewpoint of the trigger operation, it is necessary from the efficiency to bias the PN diode near the opposite region of the anode and the cathode in a forward direction in order to trigger the SCR efficiently, as pointed out by the above two conventional examples. However, because the current of the $P^+$/N-well diode flows on the opposite side to the anode and the cathode, a region where the $P^+$/N-well diode is biased in the forward direction is localized, resulting in low trigger efficiency. It should be noted that because it is not possible to decrease the N-well resistance, it is not preferable from the viewpoint of the holding voltage control, in the method in which the triggering current is supplied to the N-well, such as the sixth and seventh conventional examples.

As described above, conventionally, there is no ESD protection device capable of meeting the structure in which the vertical-type bipolar transistor device 12 of the SCR is turned on at high speed, the structure in which the substrate current can be supplied efficiently, and the structure in which the layout area can be decreased. The development of the ESD protection device which can meet the above requests is strongly demanded.

Also, as described above, it is very important to adjust the holding voltage of the SCR stably. Especially, in recent years, the STI (Shallow Trench Isolation) process has been used and the resistances in the wells have a large deviation. In actual, the N-well resistance and the substrate resistance often depend on the $N^+$ region area in the N-well, the $P^+$ region area in the P-well and the layout of them. When the SCR is applied to the product, it is necessary to tailor the performance such as the holding voltage through experimental production and the evaluation.

In the SCR, in which the trigger device is not used like the eighth and ninth conventional examples, the triggering voltage is 40 V and in the modified SCR (MSCR), the triggering voltage is 10 V However, because the breakdown voltage of a fine element or device at present is considerably lower than the above value, the SCRs are not applicable.

In the holding voltage adjustable SCR (, which is also called HHI-SCR) of a double trigger system shown in FIG. 12, in which the trigger operation is carried out by the different trigger devices, as described in the tenth conventional example, the timings when the trigger devices begin to supply the triggering current are not matched to each other. Therefore, when the current flows into the N-well, the hole current outputted from the PN diode flows into the P-well voltage control $P^+$ region. However, because the resistance value of the P-well voltage control $P^+$ region is generally set low, the triggering current has become high. Also, in the holding voltage adjusting method of the tenth conventional example, the degrees of freedom of the design is low because the triggering voltage and the holding voltage are adjusted using the same resistance elements.

In addition, US Patent Publication (2003/0164508: fourteenth conventional example) is a modification of LVTSCR, using a triggering voltage adapter network and a holding voltage adapter network in order to change the characteristic of current vs. voltage by adjusting the triggering voltage and the holding voltage of the SCR to meet the special requirement of various chips.

However, LVTSCR itself has several problems, such as voltage overshooting, as is described above. This conventional example is substantially the same as the well-known ggMOS (gate-coupled MOS). Also, in US Patent Publication (2003/0213971: fifteenth conventional example), it is described in the specification of this reference that this structure is employed in order to increase a current amplification factor β of each of the bipolar transistors. However, our experimental production suggested that there is a case where a base resistance of each bipolar transistor in the SCR is remarkably low, when an $N^+$ region in an N-well and $P^+$ region in a P-well are connected directly to a pad and a ground potential. Therefore, the SCR would not operate in the worst.

SUMMARY OF THE INVENTION

Therefore, an object of the present invention is to provide an electro-static discharge (ESD) protection device which it is possible to operate a vertical-type bipolar transistor device at high speed.

Another object of the present invention is to provide an ESD protection device which can supply a substrate current efficiently.

Another object of the present invention is to provide an ESD protection device which can restrain a layout to a small area.

Another object of the present invention is to provide an easy ESD protection device which the performance control of a holding voltage and a clamp voltage is easy.

In an aspect of the present invention, an electro-static discharge (ESD) protection device includes a first conductive type well and a second conductive type well which are formed in a surface of the first conductive type layer or a first conductive type substrate. A first high concentration second conductive type region, a first high concentration first conductive type region, and a second high concentration second conductive type region are formed in a surface of the second conductive type well. A third high concentration second conductive type region is formed in a surface of the first conductive type well. The first high concentration second conductive type region and the first high concentration first conductive type region are connected with a first power supply of a potential. The third high concentration second conductive type region is connected with a second power supply having a potential different from the potential of the first power supply. The second high concentration second conductive type region is set to a potential different from the first power supply.

In another aspect of the present invention, an ESD protection device includes a first conductive type layer or a first conductive type substrate. A first well of a first conductive type and a second conductive type well are formed adjacent to each other in a surface of the first conductive type layer or the first conductive type substrate. A second well of the first conductive type is formed in the surface of the first conductive type layer or the first conductive type substrate. A first high concentration second conductive type region, a second high concentration second conductive type region and a first high concentration first conductive type region are formed in a surface of the second conductive type well. A third high concentration second conductive type region is formed in a surface of the first well of the first conductive type. A second high concentration first conductive type region is formed in a surface of the second well of the first conductive type. The first high concentration second conductive type region and the first high concentration first conductive type region are connected with a first power supply of a potential. The third high concentration second conductive type region and the second high concentration first conductive type region are connected with a second power supply having a potential different from the potential of the first power supply. The second high concentration second conductive type region is connected with a trigger circuit.

Here, the trigger circuit may have a MOS transistor connected between the second high concentration second conductive type region and the second power supply.

Also, the trigger circuit may have diodes connected between the second high concentration second conductive type region and the second power supply.

Also, the first high concentration first conductive type region and the third high concentration second conductive type region may be arranged adjacent to each other.

Also, the second high concentration second conductive type region and the third high concentration second conductive type region may be adjacent to each other.

Also, each of the first high concentration second conductive type region and the second high concentration second conductive type region may include a plurality of divisional regions. Each of the plurality of division regions of the first high concentration second conductive type region and each of the plurality of division regions of the second high concentration second conductive type region are desirably arranged alternately in a direction orthogonal to a direction of arrangement of the second high concentration first conductive type region and the third high concentration second conductive type region. The first high concentration first conductive type region extends between every two of the plurality of division regions.

Also, the first high concentration second conductive type region may be separated into two divisional regions which are arranged separately in a direction orthogonal to a direction of arrangement of the second high concentration first conductive type region and the third high concentration second conductive type region. The second high concentration second conductive type region is arranged between the two divisional regions of the first high concentration second conductive type region, and the first high concentration first conductive type region extends between each of the two divisional region of the first high concentration second conductive type region and the second high concentration second conductive type region.

Also, the third high concentration second conductive type region may be separated into two divisional regions which are separately arranged in a direction orthogonal to a direction of arrangement of the second high concentration first conductive type region and the third high concentration second conductive type region. The second conductive type well extends between the two divisional regions of the third high concentration second conductive type region, and the second high concentration second conductive type region is arranged in an extended region of the second conductive type well.

Also, each of the first high concentration second conductive type region and the third high concentration second conductive type region may be separated into two divisional regions which are arranged separately in a direction orthogonal to a direction of arrangement of the second high concentration first conductive type region and the third high concentration second conductive type region. The second conductive type well extends between the two divisional regions of the third high concentration second conductive type region. The second high concentration second conductive type region is arranged in an extended region of the second conductive type well, and the first high concentration first conductive type region extends between the two divisional regions of the first high concentration second conductive type region.

Also, the first high concentration second conductive type region may be separated into two divisional regions which are arranged separately in a direction orthogonal to a direction of arrangement of the second high concentration first conductive type region and the third high concentration second conductive type region. The first high concentration first conductive type region has a notch portion in its center in a division direction of the first high concentration second conductive type region on a side of the third high concentration second conductive type region, and the second high concentration second conductive type region is arranged at the notch portion.

In another aspect of the present invention, an ESD protection device includes a first conductive type well and a second conductive type well which are formed in a surface of a first conductive type layer or a first conductive type substrate. A first high concentration second conductive type region, a first high concentration first conductive type region and a second high concentration second conductive type region are formed in a surface of the second conductive type well. A third high concentration second conductive type region and a third high concentration first conductive type region are formed in a surface of the first conductive type well. The first high concentration second conductive type region and the first high concentration first conductive type region are connected with a first power supply of a potential. The third high concentration second conductive type region is connected with a second power supply of a potential different from the potential of the first power supply, and the second high concentration second conductive type region and the third high concentration first conductive type region are connected through a diode.

In another aspect of the present invention, an ESD protection device includes a first conductive type layer or a first conductive type substrate. A first well of a first conductive type and a second conductive type well are formed adjacent to each other in a surface of the first conductive type substrate or the first conductive type layer. A second well of the first conductive type is formed in the surface of the first conductive type layer or the first conductive type substrate. A first high concentration second conductive type region, a first high concentration first conductive type region and a second high concentration second conductive type region are formed in a surface of the second conductive type well. A third high concentration first conductive type region and a third high concentration second conductive type region are formed in a surface of the first well of the first conductive type. A second high concentration first conductive type region is formed in a surface of the second well of the first conductive type. The first high concentration second conductive type region and the first high concentration first conductive type region are connected with a first power supply of a potential. The third high concentration second conductive type region and the second high concentration first conductive type region are connected with a second power supply of a potential different from the potential of the first power supply. The second high concentration second conductive type region and the third high concentration first conductive type region are connected through a diode.

Here, the third high concentration second conductive type region may be separated into two divisional regions which are separately arranged in a direction orthogonal to a direction of arrangement of the second high concentration first conductive type region and the third high concentration second conductive type region. The second conductive type well extends between the two divisional regions of the third high concentration second conductive type region, and the second high concentration second conductive type region is arranged in an extended region of the second conductive type well. The third high concentration first conductive type region is separated into two divisional regions which are arranged outside an opposing region of the first high concentration first conductive type region and the third high concentration second conductive type region. In this case, the second conductive type well may extend to a back of an opposing region of the divisional regions of the third high concentration first conductive type region and the second high concentration second conductive type region.

Also, in the above, the second high concentration second conductive type region and the third high concentration second conductive type region may be arranged adjacent to each other.

Also, in the above, the width of the second high concentration second conductive type region may be a minimum width where a contact can be formed in a permissible range of a design rule.

In another aspect of the present invention, an ESD protection device includes a P-type layer or a P-type substrate. An N-well is formed in a surface of the P-type layer or the P-type substrate. A first high concentration N-type region, a first high concentration P-type region and a second high concentration N-type region are formed in a surface of the N-well. A third high concentration N-type region, a second high concentration P-type region and a third high concentration P-type region are in the surface of the P-type substrate or the P-type layer. A first resistance element connected between the first high concentration P-type region and the second high concentration N-type region. A second resistance element is connected between the second high concentration P-type region and the third high concentration P-type region. The first high concentration N-type region and the first high concentration P-type region are connected with a first power supply of a potential. The third high concentration N-type region and the second high concentration P-type region are connected with a second power supply of a potential different from the potential of the first power supply, and the second high concentration N-type region is connected with a trigger circuit.

Here, the second high concentration N-type region and the third high concentration N-type region may be arranged adjacent to each other.

Also, the second high concentration N-type region may have a minimum width where a contact can be formed in a permissible range of design rule.

In another aspect of the present invention, an ESD protection device includes a first conductive type layer or a first conductive type substrate. A first conductive type well and a second conductive type well are arranged adjacent to each other in a surface of the first conductive type substrate or the first conductive type layer. A first high concentration first conductive type region, a second high concentration first conductive type region and a first high concentration second conductive type region are formed in a surface of the second conductive type well. A second high concentration second conductive type region and a third high concentration first conductive type region are formed in a surface of the first conductive type well. The first high concentration second conductive type region and the first high concentration first conductive type region are connected with a first power supply of a potential. The second high concentration second conductive type region and the third high concentration first conductive type region are connected with a second power supply of a potential different from the potential of the first power supply. The second high concentration first conductive type region is connected with a trigger circuit.

Here, the second high concentration first conductive type region and the second high concentration second conductive type region may be arranged adjacent to each other.

Also, each of the first high concentration second conductive type region and the first high concentration first conductive type region may be separated into a plurality of divisional regions which are arranged into a direction orthogonal to a direction of arrangement of the first high concentration second conductive type region and the first high concentration first conductive type region. The second high concentration first conductive type region extends between every two of division regions.

In this case, a portion of extending between the division regions may have a minimum width such that a contact can be formed in a permissible range of design rule, and a portion of the second high concentration first conductive type region other than the extending portion has a width less than the minimum width.

In another aspect of the present invention, an ESD protection device includes a first conductive type layer or a first conductive type substrate. A first conductive type well and a second conductive type well are arranged adjacent to each other in a surface of the first conductive type substrate or the first conductive type layer. A first high concentration first conductive type region and a first high concentration second conductive type region are formed in a surface of the second conductive type well. A second high concentration first conductive type region and a second high concentration second conductive type region are formed in a surface of the first conductive type well. The first high concentration first conductive type region is connected with a first power supply of a potential. The second high concentration second conductive type region and the second high concentration first conductive type region are connected with a second power supply of a potential different from the potential of the first power supply, and the first high concentration second conductive type region is connected with a trigger circuit.

In this case, the first high concentration second conductive type region and the second high concentration second conductive type region may be arranged adjacent to each other.

Also, the first high concentration second conductive type region may have a minimum width such that a contact can be formed in a permissible range of design rule.

In this case, the first high concentration first conductive type region may be separated into a plurality of divisional regions which are arranged in a direction orthogonal to a direction of arrangement of the second high concentration second conductive type region and the second high concentration first conductive type region. The first high concentration second conductive type region extends between every two of the plurality of divisional regions.

In this case, the extending portion of the first high concentration first conductive type region may have a minimum width such that a contact can be formed in a permissible range of design rule. Another portion of the first high concentration first conductive type region other than the extending portion has a width less than the minimum width.

Also, in the above, a region where silicide is not formed may be provided between the high concentration regions adjacent to each other.

Also, a gate electrode may be provided between the high concentration regions adjacent to each other.

In another aspect of the present invention, an ESD protection device includes a P-type layer or a P-type substrate. An N-well is formed in a surface of the P-type layer or the P-type substrate. A first high concentration N-type region and a first high concentration P-type region are formed in a surface of the N-well. A second high concentration N-type region and a second high concentration P-type region and a third high concentration P-type region are in the surface of the P-type substrate or the P-type layer. First and second resistance elements connected between the first high concentration P-type region and the first high concentration N-type region. Third and fourth resistance elements connected between the second high concentration N-type region and a first predetermined potential. A trigger circuit is connected with a node between the first and second resistance elements and the third and fourth resistance elements. The second high concentration N-type region and the third high concentration P-type region are connected with the first predetermined potential. The first high concentration P-type region is connected with a second predetermined potential.

Here, the second high concentration N-type region and the second high concentration P-type region may be arranged adjacent to each other.

Also, the first and third resistance elements may be connected with the first high concentration P-type region and the first predetermined potential, and have resistance values lower than a resistance value of the N-well and a resistance value of the P-type layer or the P-type substrate, respectively, and the second and fourth resistance elements may be connected with the first high concentration N-type region and the second high concentration N-type region and resistance values of the second and fourth resistance elements are determined based on a desired holding voltage, respectively.

Also, a region where silicide is not formed may be provided between the high concentration regions adjacent to each other.

Also, when the ESD protection device further include a gate provided between every two of the high concentration regions, the high concentration regions are formed using the gates as a mask.

DESCRIPTION OF THE PREFERRED EMBODIMENTS

Hereinafter, the electro-static discharge (ESD) protection device of the present invention will be described in detail with reference to the attached drawings.

First Embodiment

Figure 13:
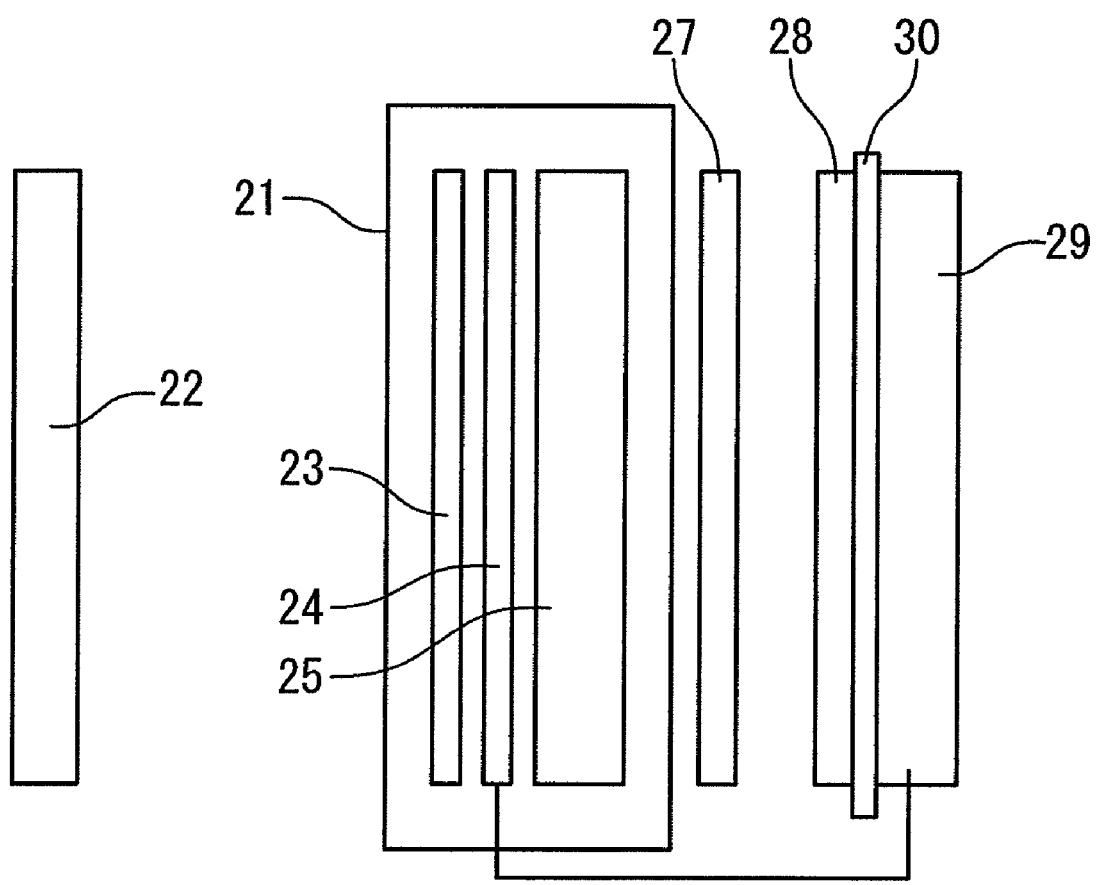
FIG. 13 is a diagram showing a layout of an ESD protection device of a first embodiment of the present invention.
Figure 14:
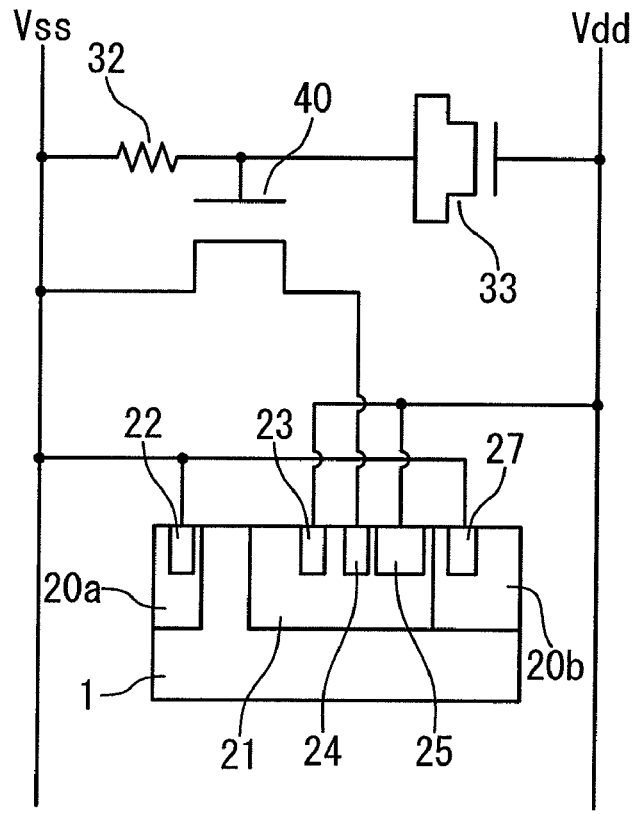
FIG. 14 is a diagram showing the arrangement of layers in the ESD protection device according to the first embodiment of the present invention.
Figure 15:
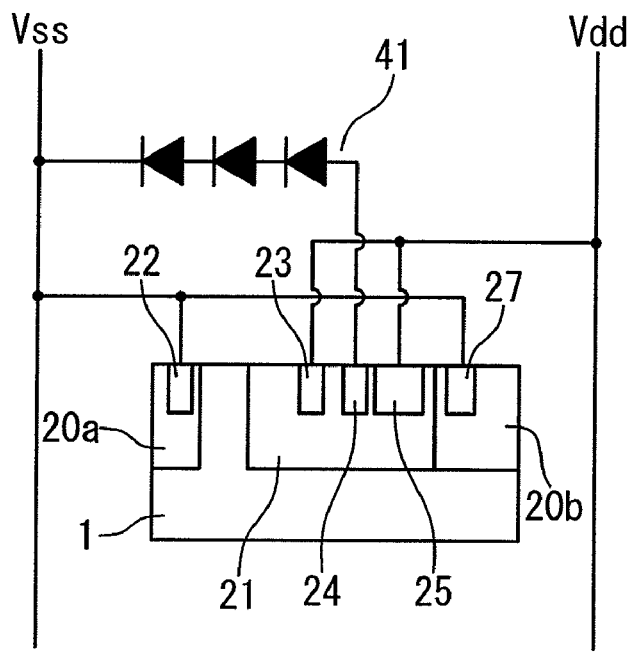
FIG. 15 is a diagram showing the ESD protection device according to a modification of the first embodiment of the present invention.

FIG. 13 is a diagram showing the layout of the ESD protection device according to the first embodiment of the present invention. FIG. 14 is a diagram showing a trigger method and showing the arrangement of each of layers and a trigger circuit. FIG. 15 is a diagram showing a modification of this trigger circuit. In the ESD protection device of this embodiment, a P-well 20a, device separation regions, a N-well 21 and a P-well 20b are formed in the surface of a P$^+$ semiconductor substrate 1, and the N-well 21 and the P-well 20b are adjacent to each other.

In the P-well 20a, a P$^+$ region 22 as a ground contact is formed for latch-up prevention, and in the first N-well 21, an N$^+$ region 23 as an N-well pick-up region, an N$^+$ region 24 for triggering current supply, and a P$^+$ region 25 as an anode of a silicon controlled rectifier (SCR) are formed. Also, in the P-well 20b adjacent to the first N-well 21, an N$^+$ region 27 as a cathode of the SCR, and a source 28 and drain 29 of a NMOS transistor are formed. On the P-well 20b between the source 28 and the drain 29, a gate electrode 30 is formed through a gate insulating film. The P$^+$ regions 22, the N$^+$ region 23, the N$^+$ region 24, the P$^+$ region 25 and the N$^+$ region 27 are separated by the device separation regions. Also, in this embodiment, a vertical-type PNP bipolar (V-PNP) transistor is formed from the P$^+$ region 25, the first N-well 21 and the P$^+$ semiconductor substrate 1, and a lateral-type NPN bipolar (L-NPN) transistor is formed from the N$^+$ region 27, the P-well 20b and the N-well 21.

In the present invention, (1) a current path is made for current to flow into the N-well 21 and (2) a path is made to supply a substrate current (hole current) from the N-well 21, for the purpose of setting the V-PNP transistor of the SCR into the conductive state. Also, in this embodiment, the pick-up region N-well, i.e., the N$^+$ region 23, and the anode, i.e., the P$^+$ region 25 are connected with a common potential (Vdd in case of power supply protection) in the N-well 21 or by an external electrode in case of power supply protection. The cathode, i.e., the N$^+$ region 27 and the latch-up prevention P$^+$ region 22 are connected with a ground potential Vss.

Also, the triggering current supply N$^+$ region 24 is provided in the N-well 21. A trigger circuit such as a NMOS transistor 40 (FIG. 14) or serial coupled diodes 41 (FIG. 15) is inserted between the N$^+$ region 24 and the ground electrode. In the trigger circuit shown in FIG. 14, a series connection of a transistor 33 and a resistance 32 is connected between the power supply potential Vdd and the ground potential Vss. In this case, the transistor function as a capacitance element, and therefore the connection of the transistor and the resistance functions an RC-timer. The gate of the NMOS transistor 40 is connected with a node between the transistor 33 and the resistance 32. The drain of this NMOS transistor 40 are connected with the triggering current supply N$^+$ region 24 and the source thereof is connected with the ground potential Vss.

In the trigger circuit shown in FIG. 15, a plurality of diodes 41 connected in series between the triggering current supply N$^+$ region 24 and the ground potential Vss. When the voltage is applied, the resistance of the circuit becomes low and these trigger circuits functions as a current source.

Next, the operation of the ESD protection device in this embodiment will be described. When surge current flows, a voltage is first applied to the trigger circuit, so that the resistance value of the circuit becomes low and the circuit functions as a current path. In other words, the current flows from the pick-up region N-well, i.e., the N$^+$ region 23 connected with the power supply potential Vdd, to the ground potential through the triggering current supply N$^+$ region 24. In this case, the potential difference is caused for a product IR between the N-well resistance and the current in N-well 21. Therefore, the potential adjacent to the bottom of the P$^+$ region 25 or the anode becomes lower than the reference potential or the power supply potential in accordance with the current quantity so that the P$^+$N diodes formed of the P$^+$ region 25 and the N-well 21 are biased in a forward direction. Therefore, the V-PNP parasitic transistor begins to turn on in this area and the triggering current is distributed to the substrate.

Figure 35:
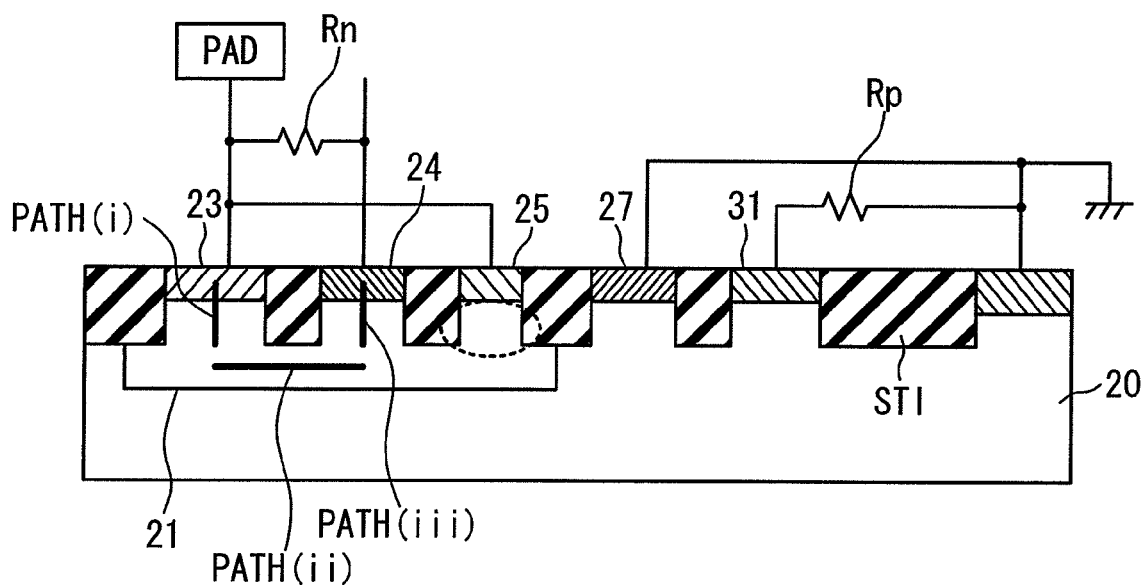
FIG. 35 is a diagram showing a trigger circuit used in the ESD protection device in the first embodiment of the present invention.

At this time, the triggering current flows from the N$^+$ region 23 to the trigger circuit through the N-well (path (i)), the N$^+$ region 24 (path (ii)) and the triggering current supply terminal the (path (iii)), as shown in FIG. 35. The potential of the N-well adjacent to the PN junction region in the bottom of the anode becomes lower than a pad potential by the potential difference caused on the current paths (i) and (ii). Through the comparison with FIG. 35, it would be understood that the potential of the whole bottom of the anode changes due to the current distribution. Therefore, the turn-on operation of the SCR can be carried out more efficiently. In the paths (i) and (iii), there is a general case that the resistance in the connection portion between the high concentration N$^+$ diffusion and the N-well is high. Thus, the potential difference component by the path (i) can be designed to be dominant using the narrower N-well pick-up diffusion region. From the viewpoint of the clamp voltage, it is advantageous that the area of the triggering current supply N$^+$ region is wider. It is desirable from the viewpoint of a high holding voltage to decrease the N-well resistance lower. Consequently, various layouts are determined, taking account of an actual resistance value from this viewpoint. Also, an external resistance may be connected between the triggering current supply electrode and the N-well pick-up diffusion region to realize the high holding voltage and to decrease a clamp voltage at the time of the SCR trigger.

The rising of the substrate potential caused by hole current generated in the V-PNP transistor means raising the base potential in the L-NPN transistor, and the L-NPN transistor is also turned on.

Then, generated electron current flows to the N-well 21 again to promote the switching operation of the V-PNP transistor to the conductive state. Thus, the positive feedback operates and the current path of the low resistance is formed at high speed between the anode and the cathode.

Generally, in the SCR, the turn-on speed is faster when the distance between the anode and the cathode is shorter. Therefore, as shown in FIG. 13, the triggering current supply $N^+$ region 24 is provided on the side opposite to the cathode (the $N^+$ region 27) with respect to the anode (the $P^+$ region 25), such that the anode (the $P^+$ region 25) and the cathode (the $N^+$ region 27) are set to be minimum.

The operation speed of the PN diode is slow because of current in the forward direction, and it takes a time until it would become low resistance or turn on. Also, as described in the conventional examples, the current path of the diode between the trigger electrode and the anode is provided on a position opposite to a path between the anode and the cathode of the SCR, and the trigger operation is not carried out efficiently.

On the other hand, in the present invention, the current is directly supplied to the N-well 21 as described above, and the potential of the whole area of the bottom of the anode can be made low in the wide area and the SCR can be turned on at high speed.

Second Embodiment

Figure 16:
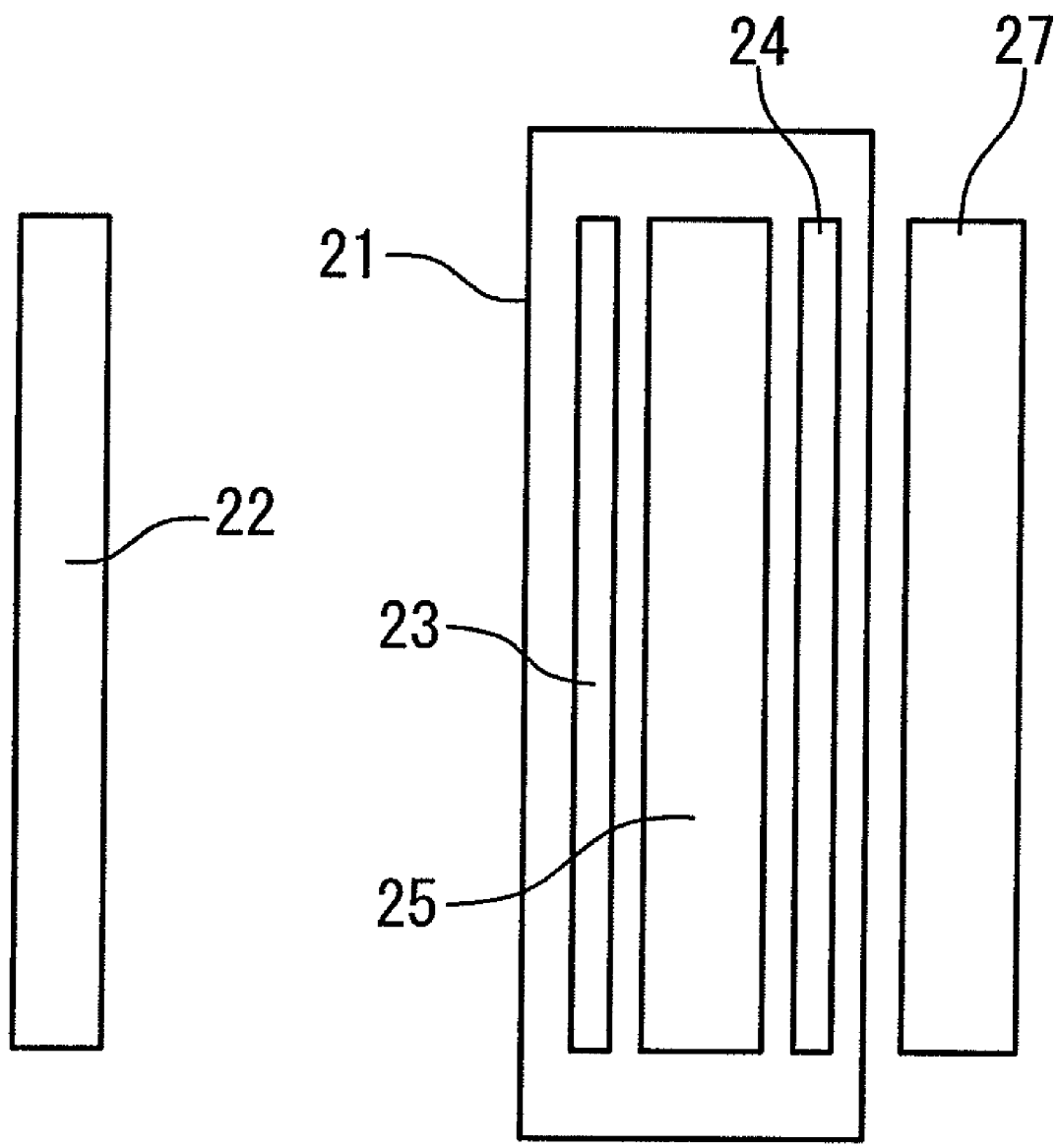
FIG. 16 is a diagram showing the layout of the ESD protection device according to a second embodiment of the present invention.
Figure 17:
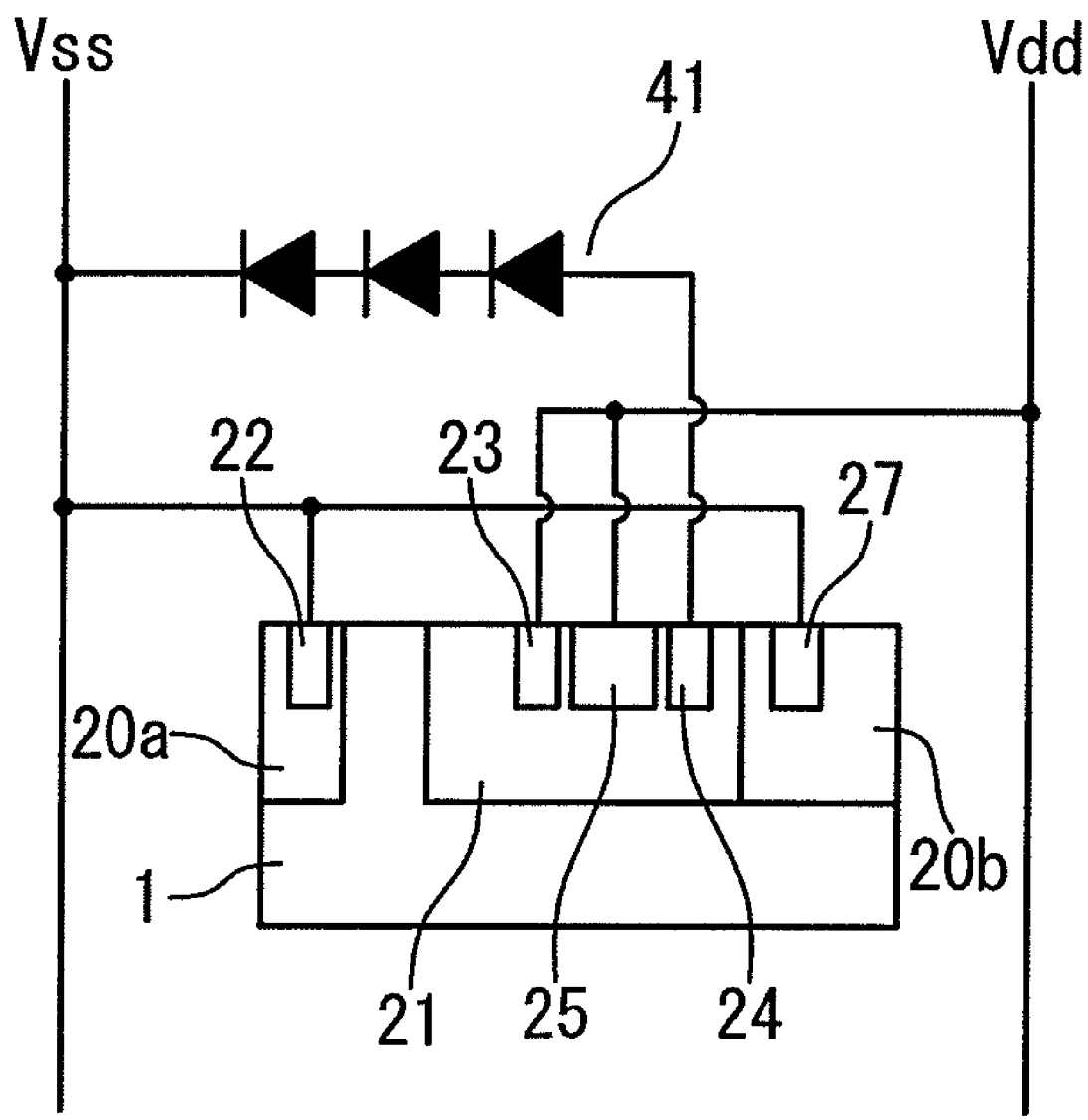
FIG. 17 is a diagram showing the arrangement of the layers and the equivalent circuit of the trigger circuit.

Next, the ESD protection device according to the second embodiment of the present invention will be described with reference to FIG. 16 and FIG. 17. In this embodiment, the triggering current supply $N^+$ region 24 in the N-well 21 is arranged in the neighborhood of the $N^+$ region 27 as the cathode of the SCR in the P-well 20b. The $P^+$ region 25 as the anode of the SCR in the N-well 21 is arranged between the $N^+$ region 23 of the N-well pick-up region and the triggering current supply $N^+$ region 24. Therefore, the triggering current supply $N^+$ region 24 is provided in the N-well 21 between the anode and the cathode. In this case, the distance between the N-well 21 and the cathode is the shortest distance. The distance between the N-well and the anode is less than 1 μm since the triggering current supply $N^+$ diffusion layer 24 is designed to be minimum. The base width of the L-NPN transistor mainly determines the turn-on speed in case of SCR operation, and in many cases, there is no influence to the turn-on speed of the SCR even if the anode and the N-well are separated to this degree.

Figure 18A:
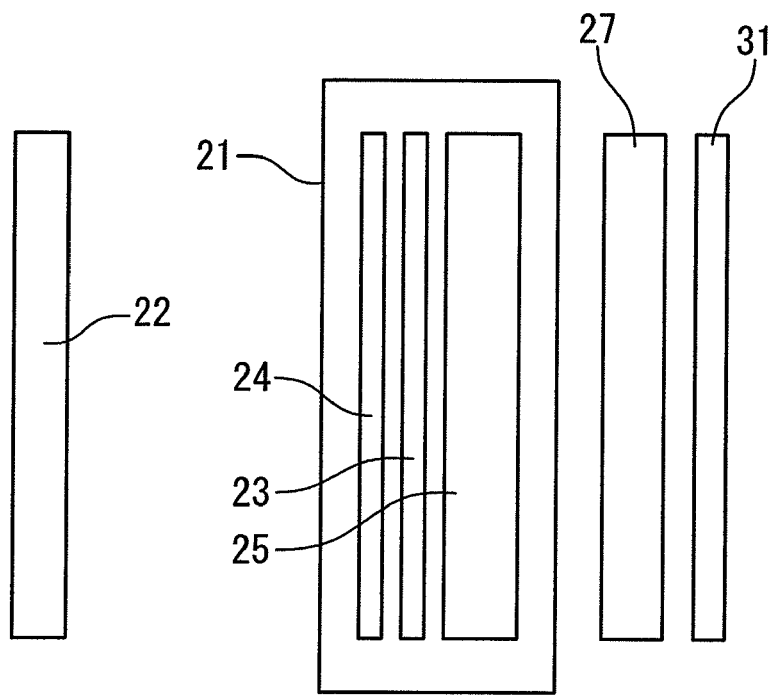
FIG. 18A is a diagram showing the layout of the ESD protection device according to a first modification of the first embodiment of the present invention.
Figure 18B:
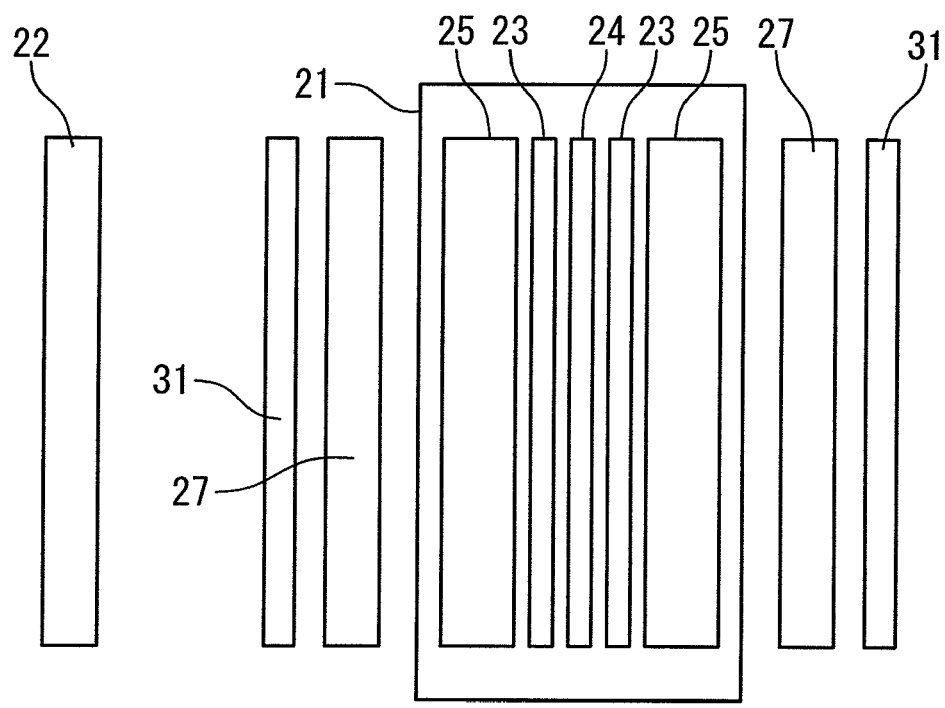
FIG. 18B is a diagram showing the layout of the ESD protection device according to a second modification of the first embodiment of the present invention.
Figure 19A:
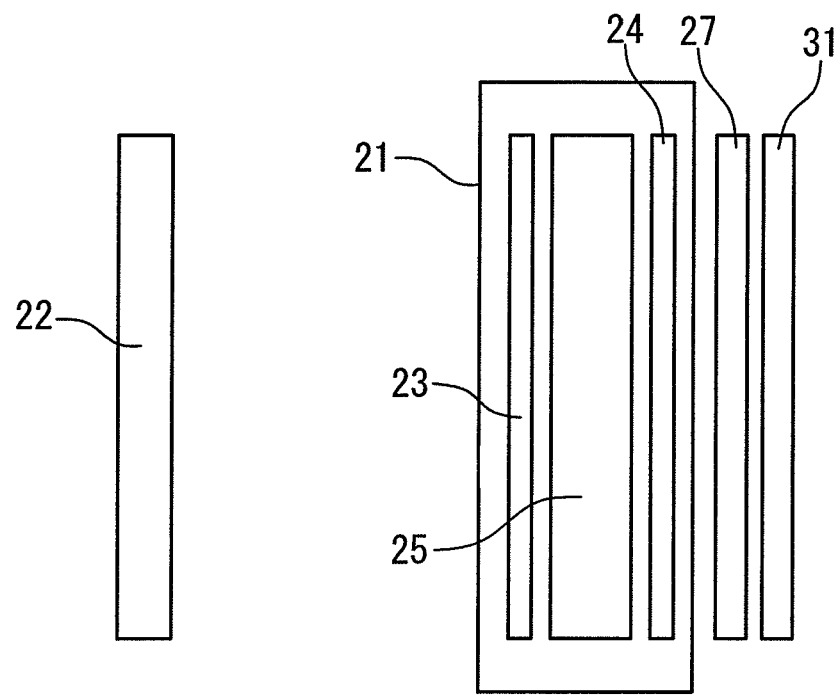
FIG. 19A is a diagram showing the layout of the ESD protection device according to a first modification of the second embodiment of the present invention and FIG. 19B is a diagram showing the layout of the static electricity protection device according to a second modification of the second embodiment.
Figure 19B:
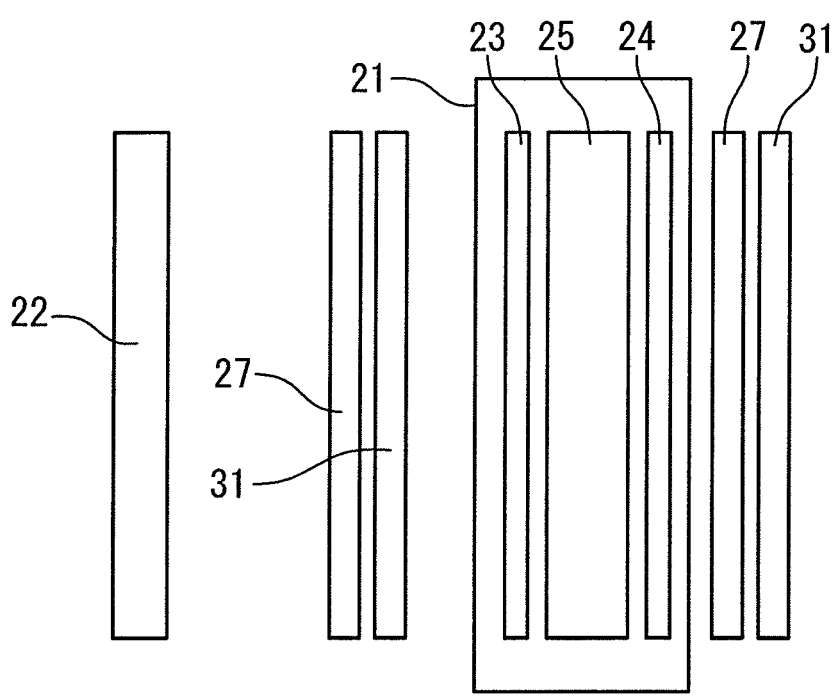

However, the arrangement of the $P^+$ region 24 as the $P^+$ guard ring in the ESD protection device or a local ground of the SCR (the ground potential provided around the cathode of the SCR) depends on the manufacturing process. For example, the ESD protection device in the first embodiment shown in FIG. 13 is arranged, presupposing that a low resistance substrate is used. Therefore, the resistance of the silicon substrate as the bottom of the SCR is very small and the potential of the SCR does not influence the arrangement of the $P^+$ guard ring and the local ground. FIG. 18A is a plan view showing the layout of the ESD protection device according to a first modification of the first embodiment shown in FIG. 13, and FIG. 18B is a plan view showing the layout of the ESD protection device according to a second modification.

Figure 1:
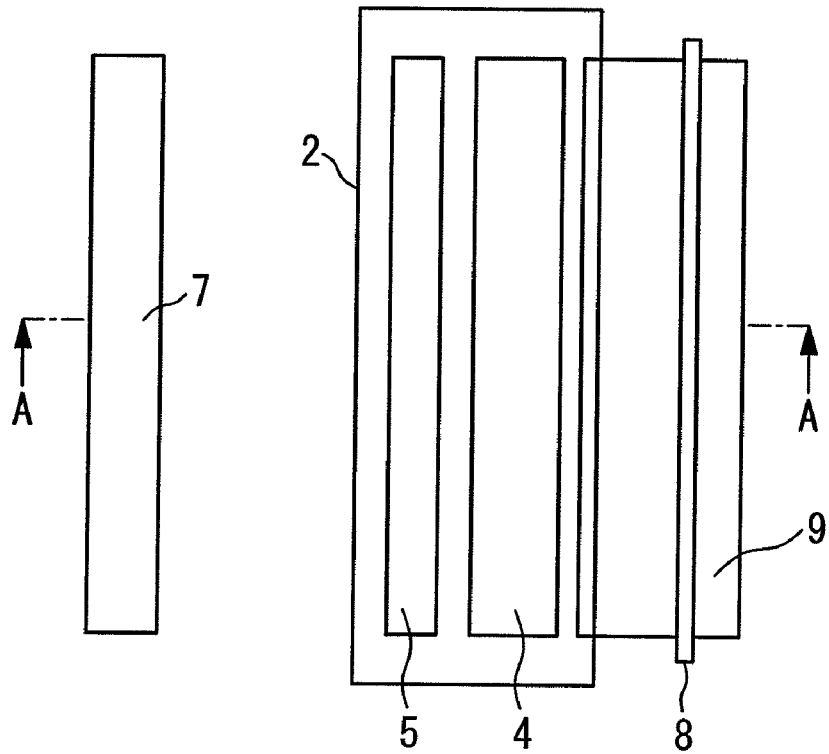
FIG. 1 is a plan view showing a layout of a low voltage trigger SCR in an ESD protection device of a first conventional example.
Figure 2:
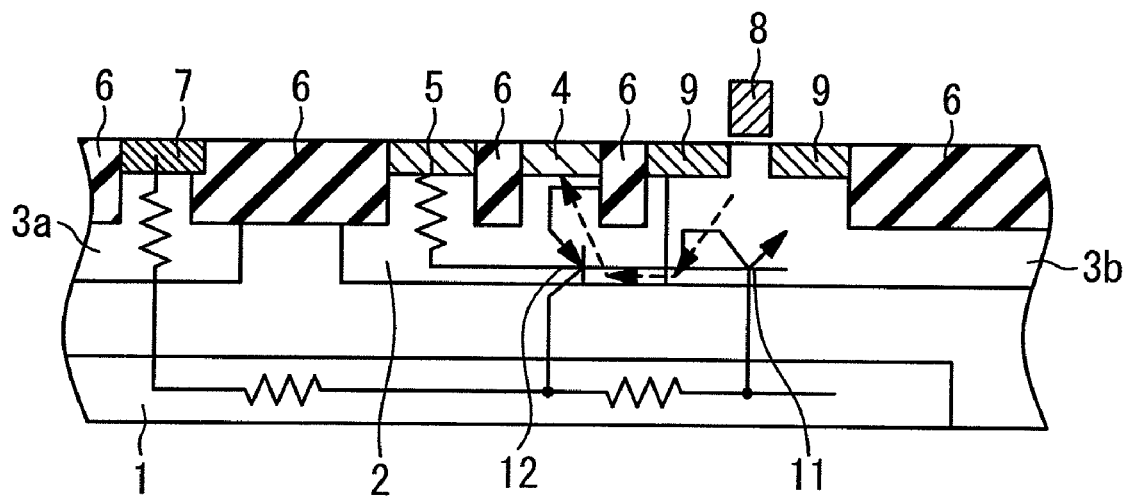
FIG. 2 is a cross sectional view of the ESD protection device of FIG. 1 along the A-A line.
Figure 3:
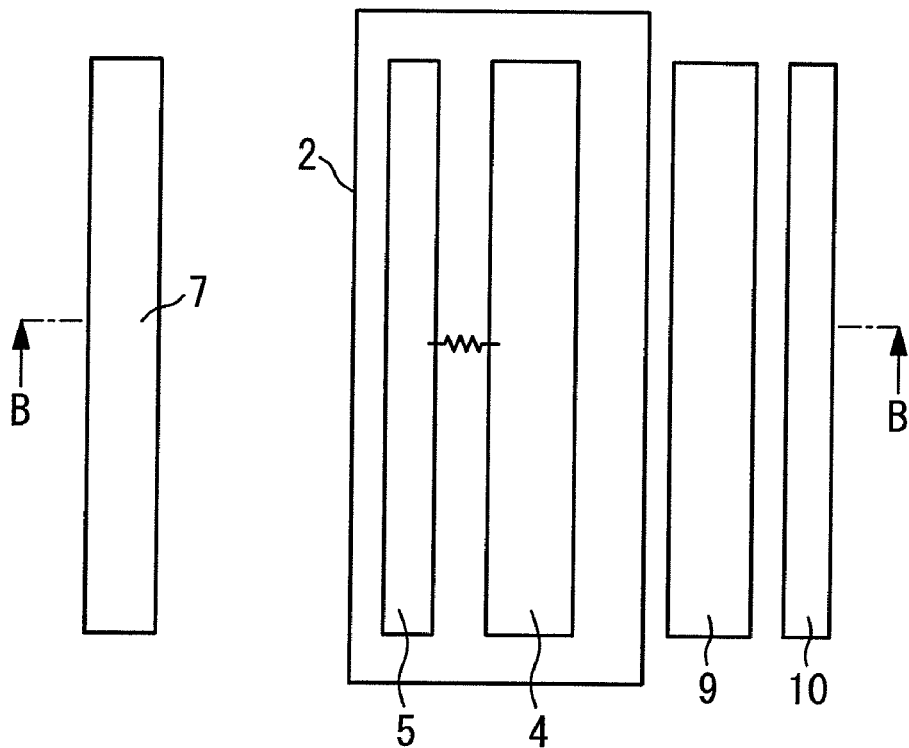
FIG. 3 is a plan view showing a layout of the ESD protection device of a second conventional example.
Figure 4:
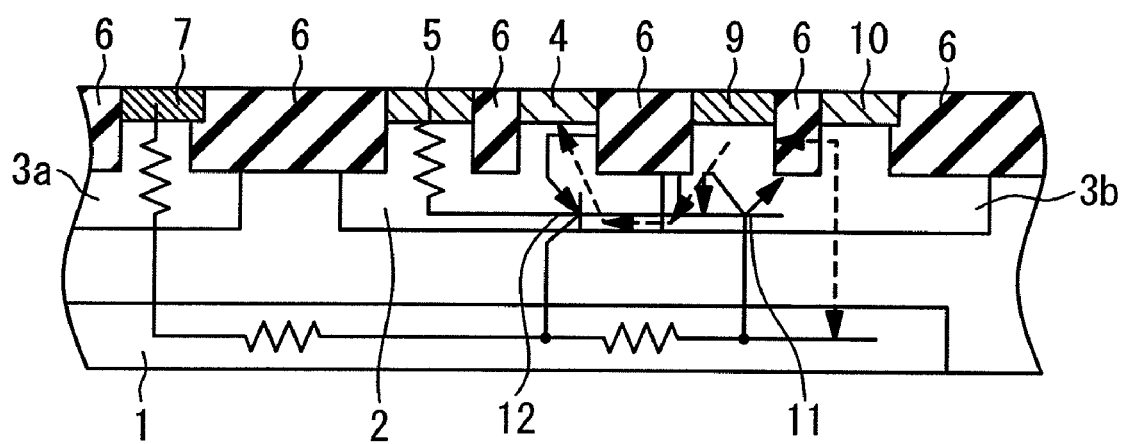
FIG. 4 is a cross sectional view of the ESD protection device along the B-B line of FIG. 3.
Figure 5:
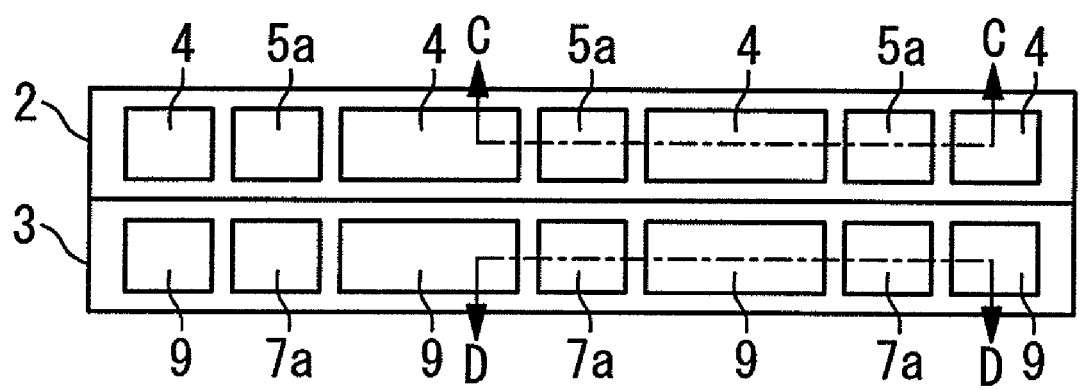
FIG. 5 is a plan view showing a layout of a SCR.
Figure 6A:
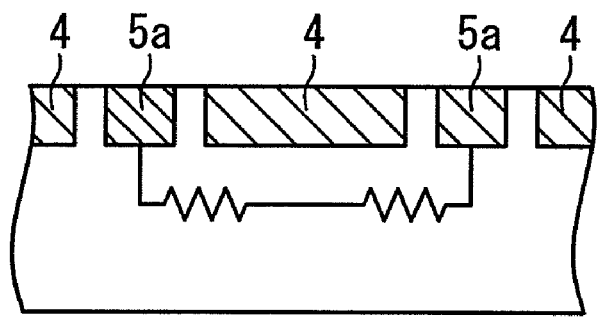
FIG. 6A is a cross sectional view of the SCR along the C-C line of FIG. 5.
Figure 6B:
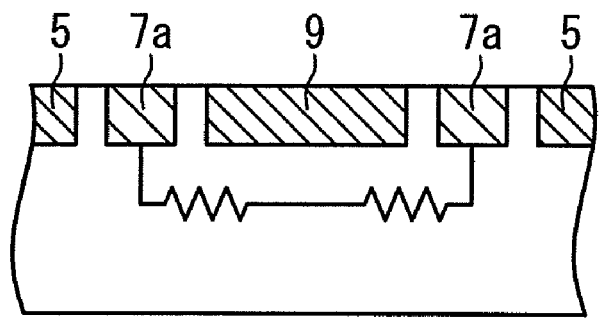
FIG. 6B is a cross sectional view of the SCR along the D-D line of FIG. 5.
Figure 7:
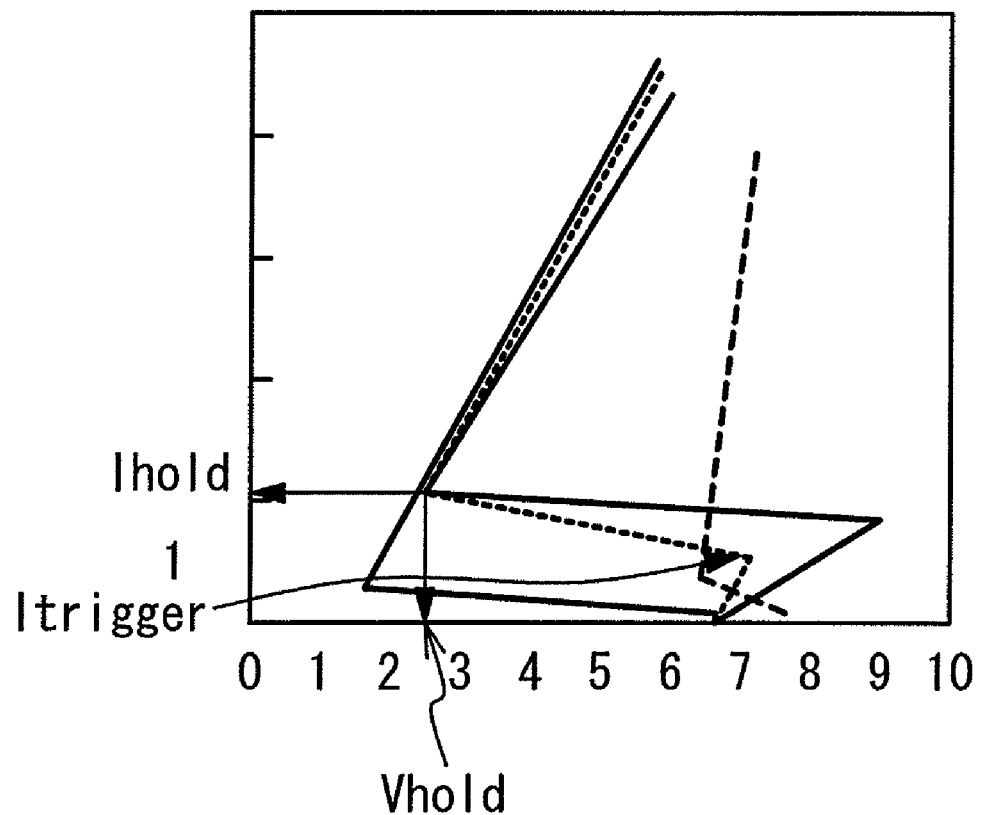
FIG. 7 is a graph showing characteristics of various types of SCRs.
Figure 8:
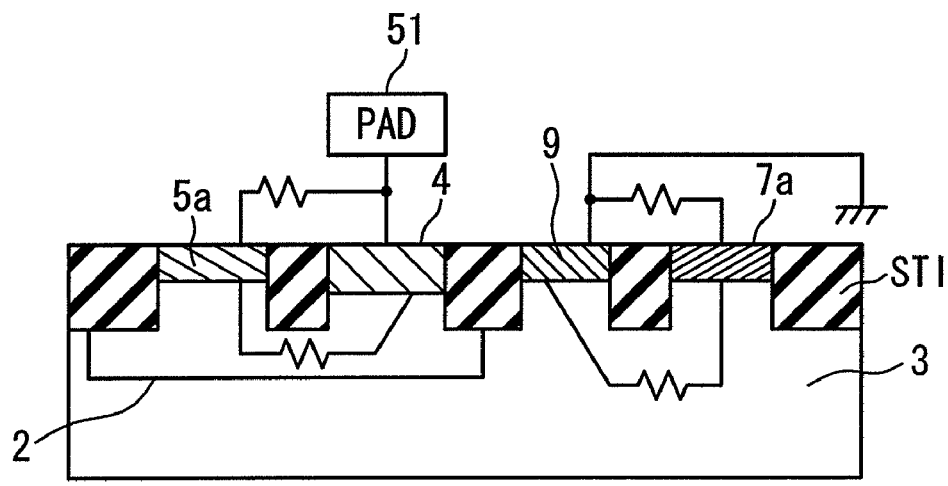
FIG. 8 is a diagram showing a conventional holding voltage adjustable SCR to which resistance elements are added.
Figure 9:
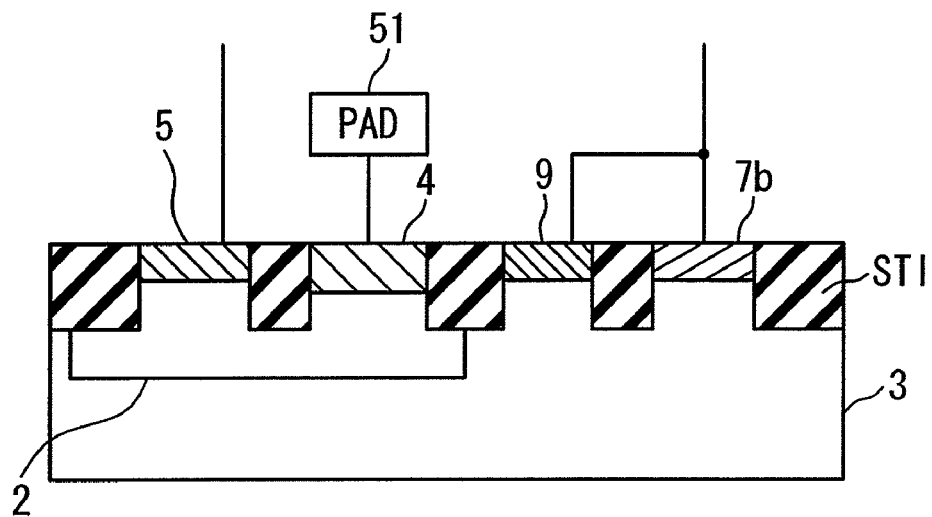
FIG. 9 is a diagram showing a conventional SCR in which a PN diode is connected with a trigger device.
Figure 10:
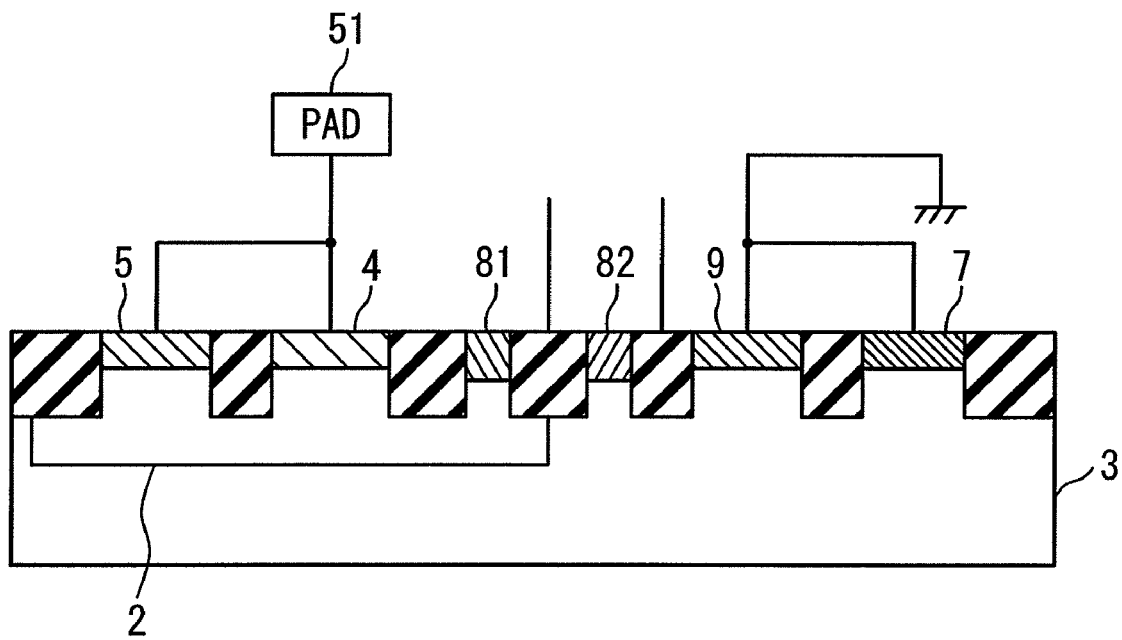
FIG. 10 is a diagram showing a SCR in which triggering current supply diffusion layers are arranged between an anode and a cathode.
Figure 11:
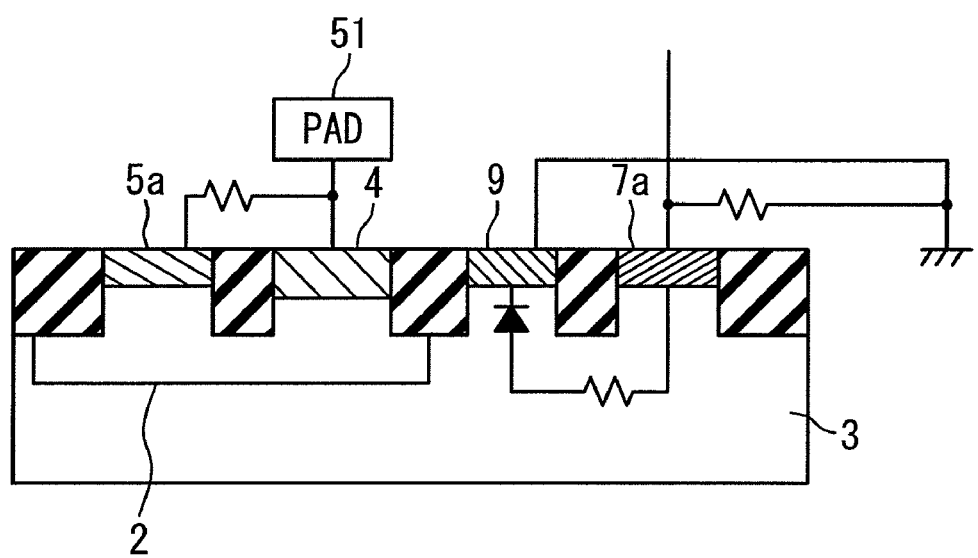
FIG. 11 is a cross sectional view showing a conventional SCR corrected to a usual layout.
Figure 12:
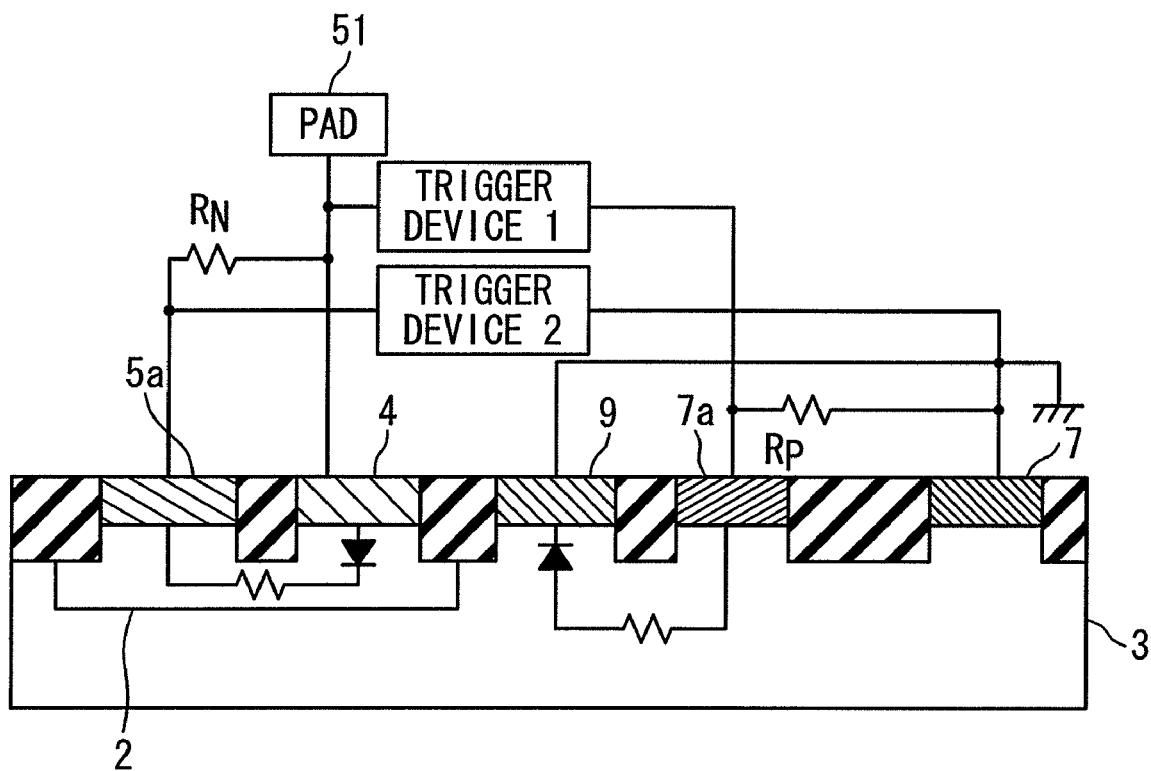
FIG. 12 is a diagram showing in a modification of a tenth conventional example of SCR.

In the ESD protection device of the sixth conventional example shown in FIG. 3, the trigger position is arranged near to the cathode of the SCR to improve the trigger efficiency, according to confirmation experiments of the inventors. This is because the wide P-well is formed and the current spreads to the whole path so that the resistance is difficult to increase.

On the other hand, in the present invention, the trigger electrode is provided for the N-well. Because the N-well is formed in a small space, the current density becomes high and the voltage drop can be achieved efficiently. Also, as described above, the current flows into a narrow area in the N-well via the bottom of the anode to lower the potential of the whole bottom region of the PN junction in the anode. For example, in case of the structure of the first and second modifications shown in FIG. 18A and FIG. 18B, the effect is large.

It should be noted that from the above-mentioned reasons, the arrangement of the trigger diffusion layer is not limited to embodiments or modifications in the present invention. The trigger diffusion layer may be arranged comparatively optionally. In the other embodiments, the arrangement of the diffusion layer can be properly designed based on the process like the ESD protection devices according to the above-mentioned embodiments and the modifications. Therefore, the present invention is applicable to the holding voltage adjustable SCR.

Third Embodiment

Figure 20:
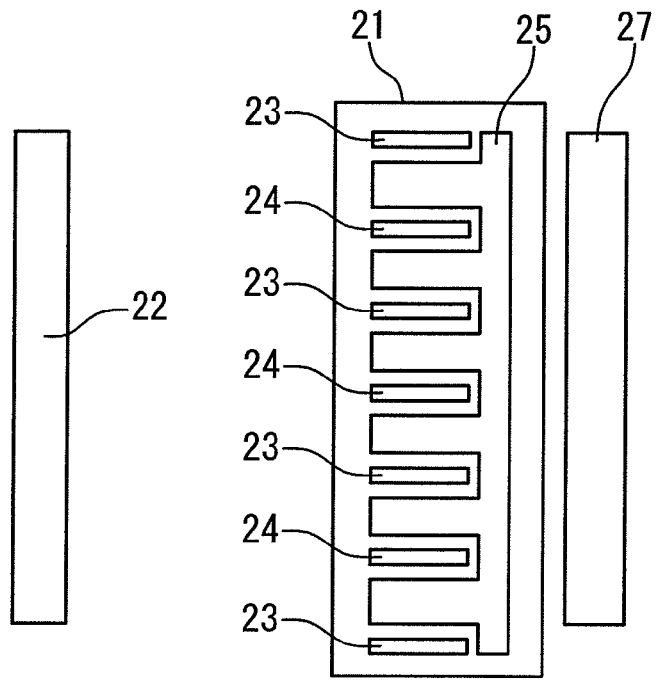
FIG. 20 is a diagram showing the layout of the ESD protection device according to a third embodiment of the present invention.

Next, the ESD protection device according to the third embodiment of the present invention will be described with reference to FIG. 20. In this embodiment, the $N^+$ region 23 of the N-well pick-up diffusion region and the triggering current supply $N^+$ region 24 are alternately arranged in the N-well 21 in the direction orthogonal to the direction of the arrangement of the $P^+$ region 22 in the P-well 20a and the $N^+$ region 27 in the P-well 20b. A single comb type of the $P^+$ region 25 (the anode) is arranged between the $N^+$ regions 23 and the $N^+$ region 24.

In the ESD protection device of this embodiment, a distance between the anode (the $P^+$ region 25) and the cathode (the $N^+$ region 27) can be made the shortest and it is easy for the potential difference to be caused because the triggering current flows through the underside of the $P^+$ region 25. Also, it is possible to decrease the resistance value between the $N^+$ region 23 of the N-well pick-up diffusion region and the triggering current supply $N^+$ region 24, and it is possible to decrease the clamp voltage until the SCR is turned on. Also, it is possible for the current to flow through the bottom region of the $P^+$ region 25, by arranging these diffusion layers alternately, and it is possible to turn on the SCR at high speed.

Fourth Embodiment

Figure 21:
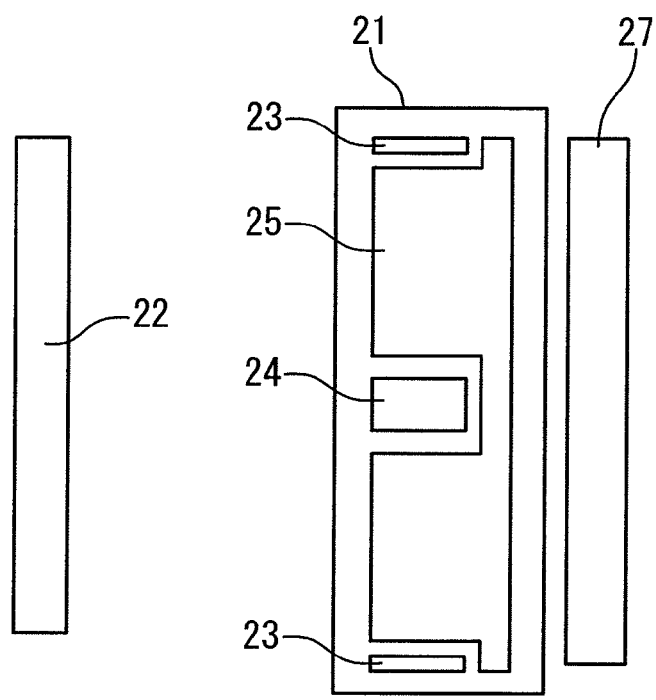
FIG. 21 is a diagram showing the layout of the ESD protection device according to a fourth embodiment of the present invention.

Next, the ESD protection device according to the fourth embodiment of the present invention will be described with reference to FIG. 21. This embodiment has a layout similar to that of the third embodiment shown in FIG. 20. However, the fourth embodiment is different from the third embodiment in the following points. That is, a pair of $N^+$ regions 23a and 23b as an N-well pick-up diffusion regions is arranged in both ends of the N-well 21 (both ends in a direction orthogonal to the arrangement direction of the $P^+$ region 22 and the $N^+$ region 27). The triggering current supply $N^+$ region 24 is arranged at the center between the $N^+$ regions 23a and 23b.

In this fourth embodiment, the current flows from one pair of the $N^+$ regions 23a and 23b into the center of the N-well 21. At this time, the center of the N-well 21 has a large potential difference from both ends. Thus, the V-PNP transistor is set to the conductive state, and the SCR is triggered.

Fifth Embodiment

Figure 22:
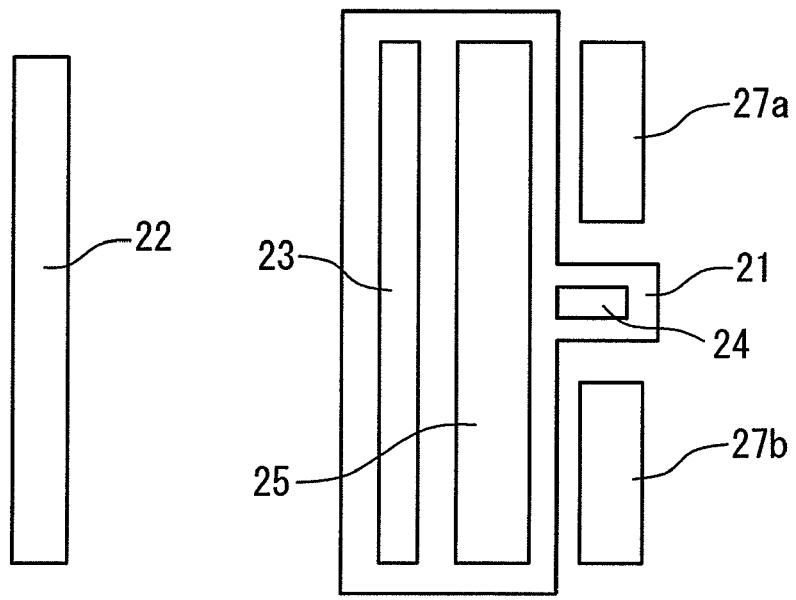
FIG. 22 is a diagram showing the layout of the ESD protection device according to a fifth embodiment of the present invention.

Next, the ESD protection device according to the fifth embodiment of the present invention will be described with reference to FIG. 22. In this embodiment, $N^+$ regions 27a and 27b are formed separately as the cathode, and the N-well 21 is arranged between the $N^+$ regions 27a and 27b to have an extend portion between them. The triggering current supply $N^+$ region 24 is arranged in the extended portion of the N-well 21. This embodiment achieves the same effect as each of the above embodiments, and the triggering current flows under the $P^+$ region 25.

Sixth Embodiment

Figure 23:
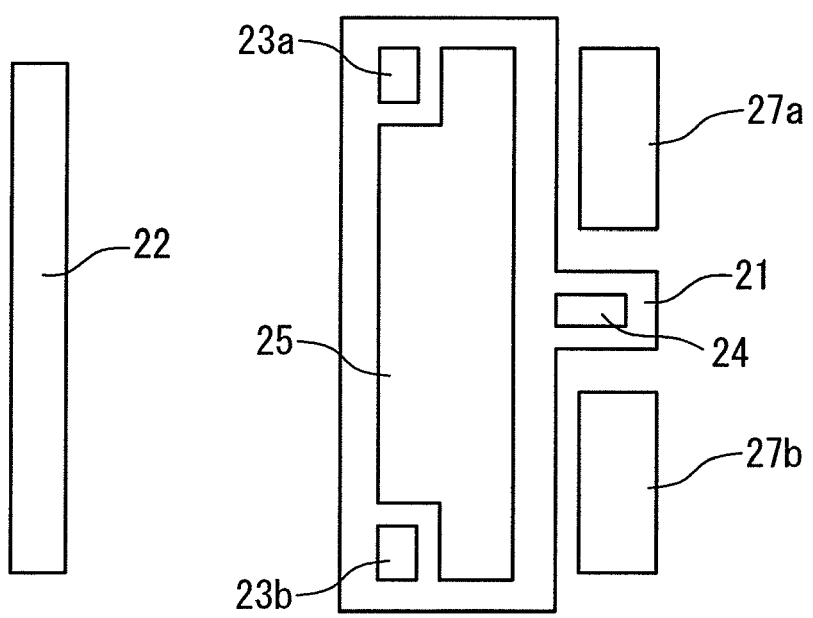
FIG. 23 is a diagram showing the layout of the ESD protection device according to a sixth embodiment of the present invention.

Next, the ESD protection device according to the sixth embodiment of the present invention will be described with reference to FIG. 23. This embodiment is different from the fifth embodiment shown in FIG. 22 in that two $N^+$ regions 23a and 23b are provided as an N-well pick-up diffusion region and the $P^+$ region 25 for the anode is arranged in the N-well 21, containing between the $N^+$ regions 23a and 23b. The sixth embodiment achieves the same effect as each of the above embodiments.

Seventh Embodiment

Next, the ESD protection device according to the seventh embodiment of the present invention will be described with reference to FIG. 24. In the SCR of this embodiment, a pair of $N^+$ regions 23a and 23b are arranged as the N-well pick-up diffusion region at both ends in a direction orthogonal to the arrangement direction of the $P^+$ region 22 and the $N^+$ region 27 in the N-well 21. The $P^+$ region 25 for the anode is formed between the $N^+$ regions 23a and 23b to have a notch portion in the center portion in the longitudinal direction on the side of the $N^+$ region 27 for the cathode. The triggering current supply $N^+$ region 24 is arranged at the notch portion.

In this embodiment, the triggering current flows into the direction shown by the arrow so that the current and resistance product (IR) biases the PN junction on the underside of the $N^+$ regions 23a and 23b as the N-well pick-up diffusion region in a forward direction. Therefore, the region near the N-well 21 of the vertical-type bipolar transistor in the N-well turns on first so that a current flows into the direction of the substrate. As described above, it is effective to increase the potential of the region near the base of the side-type bipolar transistor, i.e., between the anode and the cathode of the SCR, in order to turn on the SCR. This embodiment is desirable in this point.

Eighth Embodiment

Figure 25:
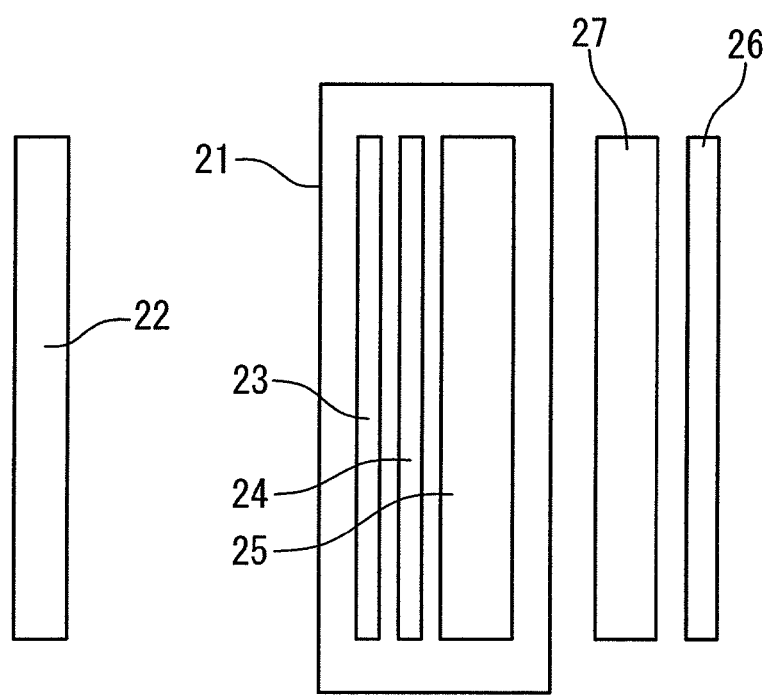
FIG. 25 is a diagram showing the layout of the ESD protection device according to an eighth embodiment of the present invention.
Figure 26:
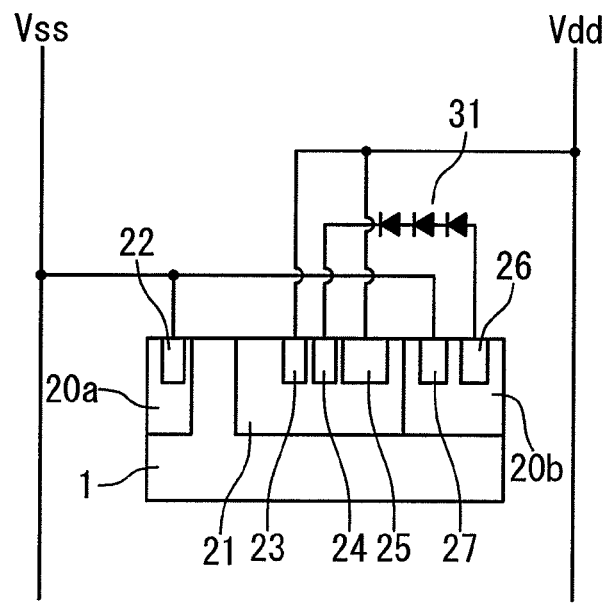
FIG. 26 is a diagram showing the arrangement of layers and connections.

Next, the SCR according to the eighth embodiment of the present invention will be described. FIG. 25 is a diagram showing the ESD protection device according to the eighth embodiment of the present invention, and FIG. 26 shows a trigger method. In this embodiment, the latch-up prevention $P^+$ region 22 as a ground contact is formed in the second P-well 20a. The $N^+$ region 23 as the N-well pick-up diffusion region, the triggering current supply $N^+$ region 24, and the $P^+$ region 25 for the anode are formed in this order in the N-well 21 from the side of the $P^+$ region 22. The $N^+$ region 27 as the cathode is formed on the side of the anode, i.e., the $P^+$ region 25 in the P-well 20b. Moreover, a triggering current supply $P^+$ region 26 is formed.

Serial coupled diodes 31 of the trigger circuit is arranged between the $N^+$ region 24 in the N-well 21 and the $P^+$ region 26 in the first P-well 20b. Also, the $P^+$ region 22, and the $N^+$ region 27 for the cathode are connected with the ground potential Vss in common. The $N^+$ region 23 of the N-well pick-up diffusion region and the $P^+$ region 25 for the anode are connected with the power supply potential Vdd in common.

In this embodiment, the trigger circuit or the serial coupled diodes 31 is arranged to connect the N-well 21 and the P-well 20b and to supply a current between both wells. In case of using a low resistance substrate 1 or a substrate, in which the substrate resistance is very low, and an epitaxial film formed on the substrate is thin and has very low resistivity, when the triggering current supply $P^+$ region 26 is arranged just near the cathode (the $N^+$ region 27), the PN diode is biased in the forward direction to set the diodes 41 to the conductive state such that an electron current flows, in addition to the path through which current is directly supplied to the substrate. The electron current is absorbed in the N-well 21. When this structure is applied to the holding voltage adjustable SCR, there would be a similar problem as described in the conventional examples.

Ninth Embodiment

Figure 27:
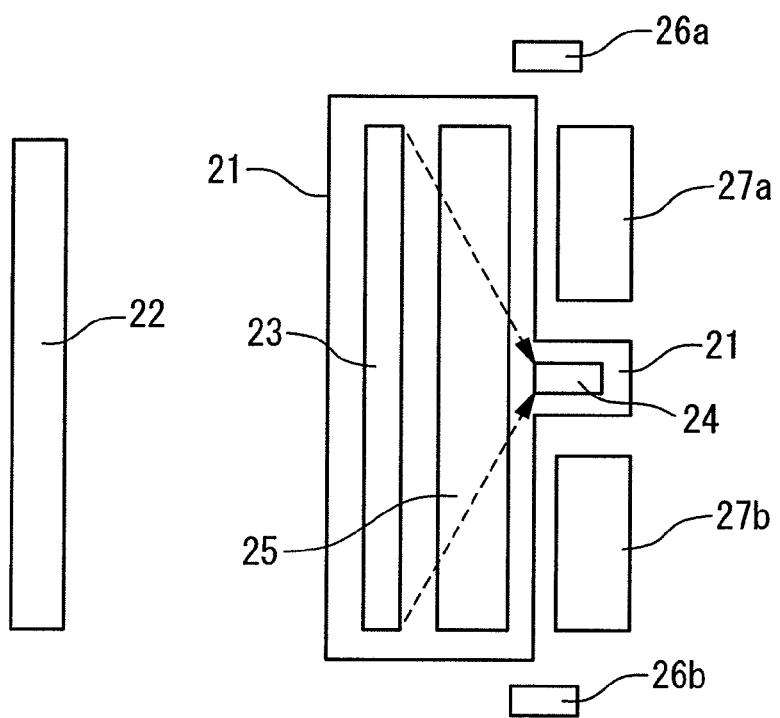
FIG. 27 is a diagram showing the layout of the ESD protection device according to a ninth embodiment of the present invention.

Next, the SCR according to according to the ninth embodiment of the present invention will be described. FIG. 27 is a diagram showing the ESD protection device according to the ninth embodiment of the present invention. The arrangement shown in FIG. 27 is different from the arrangement shown in FIG. 22 in the following point. That is, the $P^+$ regions 26a and 26b for the triggering current supply are arranged in the side of the $P^+$ region 25 for the anode and the $N^+$ regions 27a and 27b for the cathode of the SCR, i.e., the position outside a region in which the anode and the cathode opposes to each other. Thus, the current path is formed in the N-well 21 as shown by the arrow. Also, the current which flows from the $P^+$ regions 26a and 26b to the $N^+$ region 24 flows through the SCR. It should be noted that FIG. 27 shows a unit cell and a circuit or layout containing at least one unit cell is also contained in the present invention.

Tenth Embodiment

Figure 28:
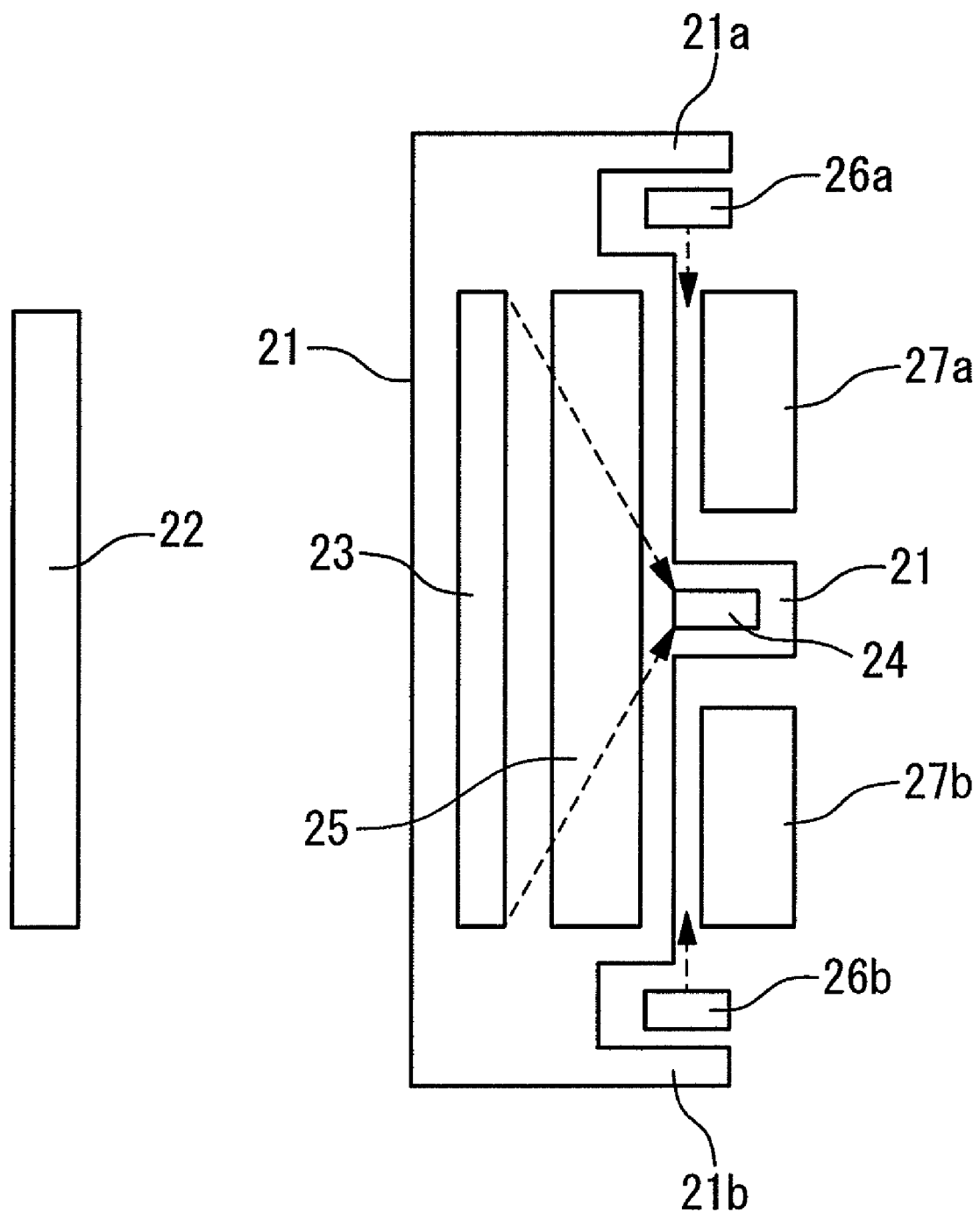
FIG. 28 is a diagram showing the layout of the ESD protection device according to an eleventh embodiment of the present invention.

Next, the SCR according to according to the tenth embodiment of the present invention will be described. FIG. 28 is a diagram showing the ESD protection device according to the tenth embodiment of the present invention. The tenth embodiment is different from the ninth embodiment shown in FIG. 27 in that portions 21a and 21b of the N-well 21 are arranged on the back side of the current path from the $P^+$ regions 26a and 26b for the triggering current supply to the $N^+$ region 24.

Thus, the substrate current from the $P^+$ regions 26a and 26b to the $N^+$ region 24 is blocked by the portions 21a and 21b of the N-well 21 and it becomes easy for the substrate current to flow into the direction of the $N^+$ region 24. In this way, when the current path from the N-well 21 to the substrate is formed, the current flowing from the $P^+$ regions 26a and 26b to the substrate gets spreads inside the SCR. It should be noted that FIG. 27 shows a unit cell and a circuit or layout containing at least one unit cell is also contained in the present invention.

Eleventh Embodiment

Figure 29:
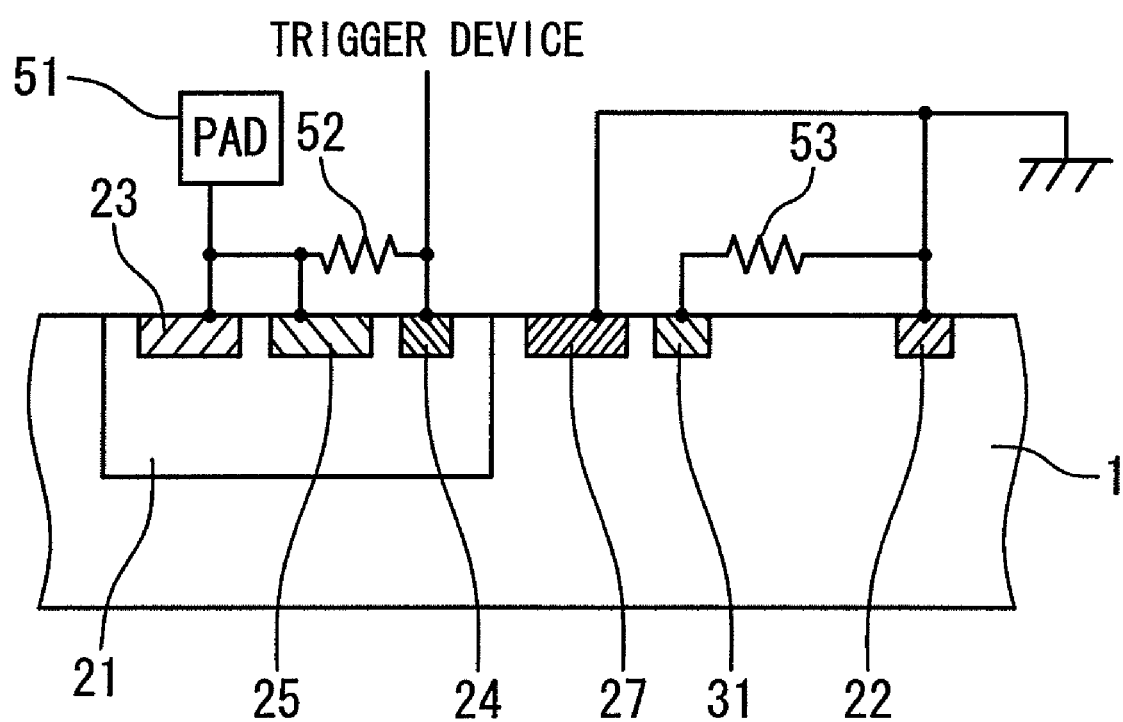
FIG. 29 is a cross sectional view showing the ESD protection device according to the eleventh embodiment of the present invention.

Next, the SCR as the holding voltage adjustable SCR according to the eleventh embodiment of the present invention will be described with reference to FIG. 29. The N-well 21 is formed in the surface of the P+ semiconductor substrate 1. The N+ region 23 of the N-well pick-up diffusion region, the P+ region 25 for anode and the triggering current supply N+ region 24 are formed in the surface of this the N-well 21. Also, the N+ region 27 for the cathode, the P+ region 26 for the triggering current supply and the P+ region 22 of the latch up prevention ground contact are formed in the surface of the P+ semiconductor substrate 1. A pad 51 is connected with the N+ region 23 of the N-well pick-up diffusion region and the P+ region 25 for the anode, and a trigger circuit (the NMOS transistor 40 shown in FIG. 14 or the serial coupled diodes shown in FIG. 15) is connected with the triggering current supply N+ region 24. The N+ region 24 is connected with the N+ region 23 and the P+ region 25 via a resistance element 52. Also, the P+ region 22 of the latch up prevention ground contact are connected and the N+ region 27 for the cathode are connected with the ground potential and the triggering current supply P+ region 26 is connected with the ground potential through a resistance element 53.

In this embodiment having the above structure, the triggering current is supplied from the trigger circuit in case of the SCR operation to operate the V-PNP transistor. The triggering voltage can be made low remarkably, compared with the ninth conventional example. Also, it is possible that a plurality of resistance elements are provided previously and desired resistance values of the resistance elements 52 and 53 can be set by connecting these resistance elements by wiring lines in an upper layer. Thus, the SCR characteristic can be adjusted. Therefore, it is advantageous that the SCR characteristic can be matched easily to process change. For example, in order to decrease the triggering voltage, the holding voltage can be mainly controlled based on the resistance element value 53 by setting the resistance element value 52 to equal to or less than 10 ohms. It should be noted that although the resistance elements 52 and 53 are used in the example shown in FIG. 29, the resistance value may be adjusted based on the area of the P+ region 26 as the P+ tap or the distance from the P+ region 22 as the P+ guard ring which is connected with the ground potential, in addition to the above example.

Also, the triggering current supply N+ region 24 functioning as an N-well potential adjustment diffusion layer may be arranged between the P+ region 25 for the anode and the N-well 21. In this case, in order to increase the holding current, it is necessary that the external resistance element is lower than the N-well resistance. In the ESD protection device of this embodiment, when the product of the triggering current and the external resistance element value becomes about 0.7 V, the PN diode between the anode and the trigger electrode sets to the conductive state and a hole current starts to flow. As shown in FIG. 29, in the ESD protection device of this embodiment, the SCR can be set to the latched state in a very short time, since the N+ region 27 for the cathode and the position where the hole current is supplied are near. Moreover, in the ESD protection device of this embodiment, most of a portion around the anode are surrounded by the triggering current supply N+ region 24 functioning as the potential adjustment N-well diffusion layer and the N-well resistance can be decreased, as would be apparent from the tenth conventional example shown in FIG. 26. As a result, the resistance value of the N-well can be made low. Thus, a selection range of the resistance value of the external resistance element can be made wide, and the potential adjustability becomes very good. Considering that the sixth conventional example and the structure shown in FIG. 38 cannot be applied to the SCR having the high triggering current, the advantage of the SCR in this embodiment could be understood.

Figure 24:
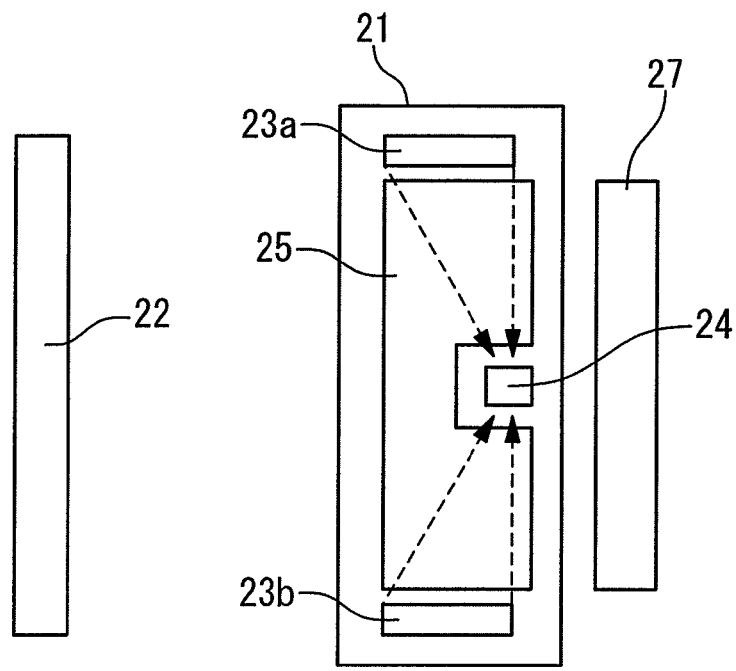
FIG. 24 is a diagram showing the layout of the ESD protection device according to a seventh embodiment of the present invention.
Figure 30A:
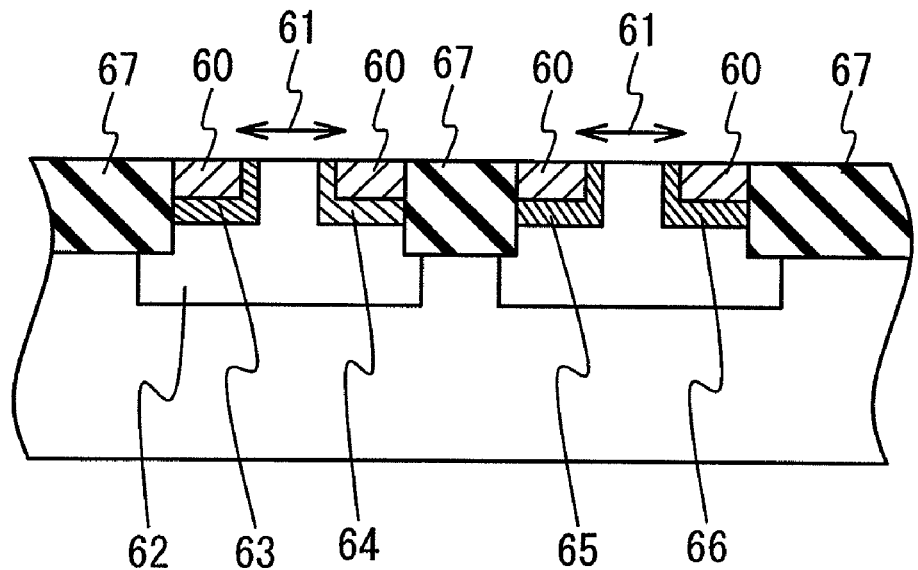
FIG. 30A is a cross sectional view showing a method of separating devices by providing a region where silicide is not formed.
Figure 30B:
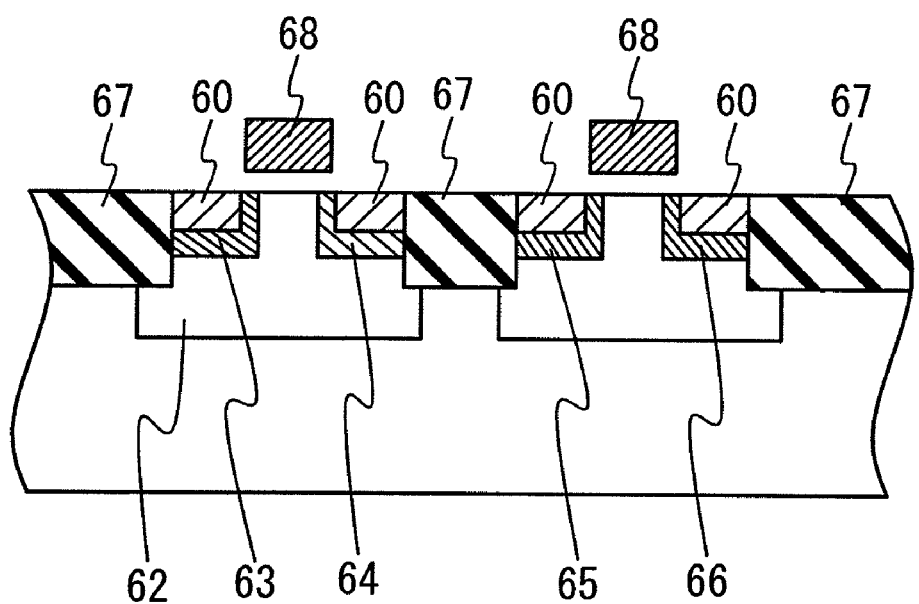
FIG. 30B is a cross sectional view showing a method of separating devices by putting a gate electrode and implanting impurities using the gate electrode as a mask.

It should be noted that a LOCOS (Local Oxidation of Silicon) method or an STI method and so on are generally applied for the device separation between the diffusion layers, as shown in FIG. 24. However, the following methods could be considered to be applicable. That is, an area where silicide is not formed is provided on the cathode diffusion layer as shown in FIG. 30A. Otherwise, a gate electrode is formed as shown in FIG. 30B, and impurities for the N+ region and impurities for the P+ region are implanted into both sides of this gate electrode. In these methods, the conductive layer of a low resistance is formed to decrease the substrate resistance and the N-well resistance in the equivalent circuit of the SCR. The example applied with this device separation is described in the seventeenth embodiment.

Twelfth Embodiment

Figure 31:
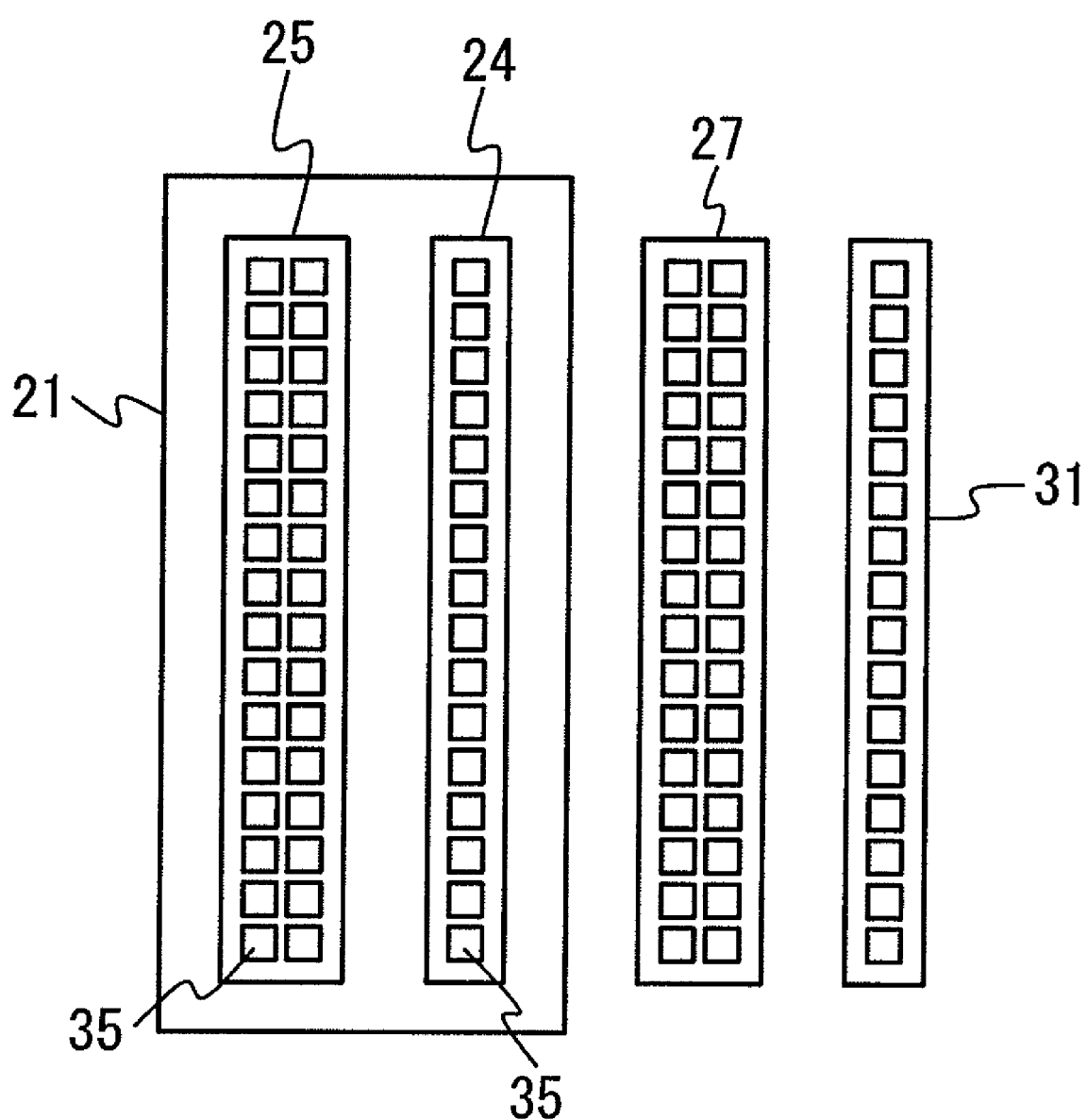
FIG. 31 is a plan view showing the layout of the ESD protection device of a twelfth embodiment of the present invention.

Next, the ESD protection device according to the twelfth embodiment of the present invention will be described. FIG. 31 is a plan view showing a layout of the ESD protection device of this embodiment. The ESD protection device of this embodiment is similar to the ESD protection device of the eighth embodiment shown in FIG. 25. The different point is in that the N-well pick-up diffusion region 23 is removed from the structure of the above-mentioned eighth embodiment.

It should be noted that the P+ region 31 functions as a P-well potential control diffusion region by connecting with the external resistance element and as the P-well pick-up diffusion region by connecting with the anode or cathode directly or by an external wiring line. In case of this structure, it is difficult to decrease the resistance value on the side of the N-well, and the holding current cannot be set high. However, the area can be reduced, compared with the static electricity protection device of above-mentioned eighth embodiment.

Thirteenth Embodiment

Figure 32A:
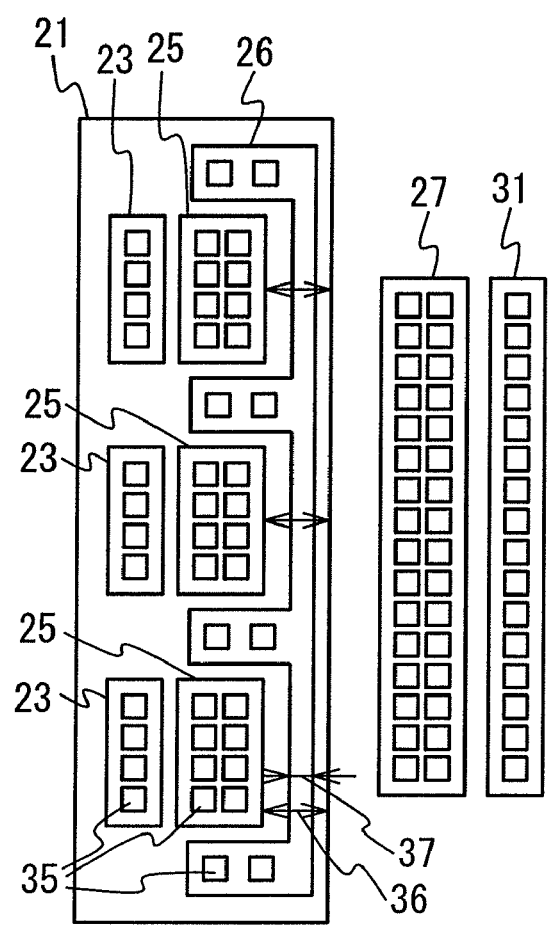
FIG. 32A is a plan view showing the layout of the ESD protection device of a thirteenth embodiment of the present invention and FIG. 32B is a plan view showing the layout of the ESD protection device of a first modification of the thirteenth embodiment.
Figure 32B:
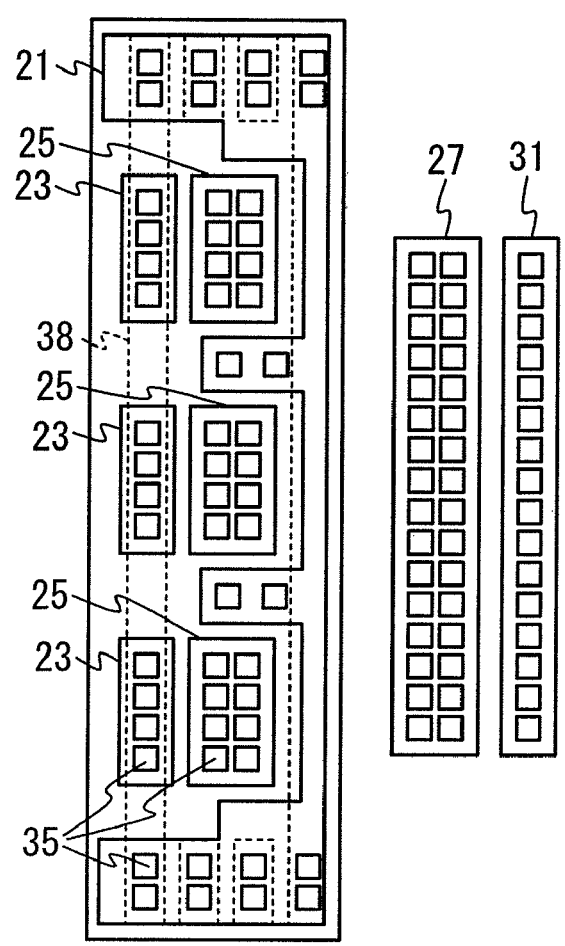

Next, the static electricity protection device of the thirteenth embodiment of the present invention will be described. FIG. 32A is a plan view showing the layout of the ESD protection device of this embodiment, and FIG. 32B is a plan view showing the layout of the static electricity protection device of a first modification of the thirteenth embodiment. In the SCR in the electro-static discharge device of the above-mentioned embodiment, it is necessary to form the contact 35 on the diffusion layer for the purpose to connect the triggering current supply N+ region 24 and the trigger device. In the process by the inventors of the present invention, a distance between the P+ region 25 for the anode and the edge of the N-well 21 is about 0.9 to 1.0 μm even when the distance is designed to be minimized. In the above-mentioned embodiment, this value is applied. Also, in the process considered by the inventors of the present invention, the distances between the anode and the N-well edge and between the cathode and the N-well edge are 0.2 or 0.3 μm and it is necessary to expand about 3 times. Generally, when the distance between the anode and the cathode is made wide, the dynamic resistance of the SCR becomes large and the breakdown current becomes low. Therefore, the characteristic of the SCR depends on the distance between the cathode and the N-well basically than the distance between the anode and the N-well. Also, the characteristic of the SCR is affected by the concentration distribution of the N-well or the P-well, the shape of the device and so on. For these reasons, it cannot say generally whether the distance relates to the degradation of the SCR. Supposing the worst case, the SCR must be designed for a distance between the anode and the N-well edge to be minimized.

However, in the conventional ESD protection device mentioned in the tenth conventional example, these points are not examined or considered. In the SCR having such a structure, actually, in order to maximize the efficiency, the design is carried out to minimize the distance between the anode and the N-well edge, for prevention the large deviation in the characteristic of the device. Therefore, in the SCR of this embodiment, the N+ region 32 for the contact is formed in the side of the anode to minimize the distance 36 between the anode and the N-well edge, as shown in FIG. 32A. The potential is connected with the N+ region 32 for the contact. Thus, the distance between the anode and the N-well edge can be reduced to 0.7 μm. As a result, the breakdown current can be made high by about 20% and the dynamic resistance can be made low. It should be noted that as shown in FIG. 32B, a diffusion layer resistance may be formed in the N-well 21 and the holding current may be controlled by changing the connection of the metal wiring lines.

Fourteenth Embodiment

Figure 33:
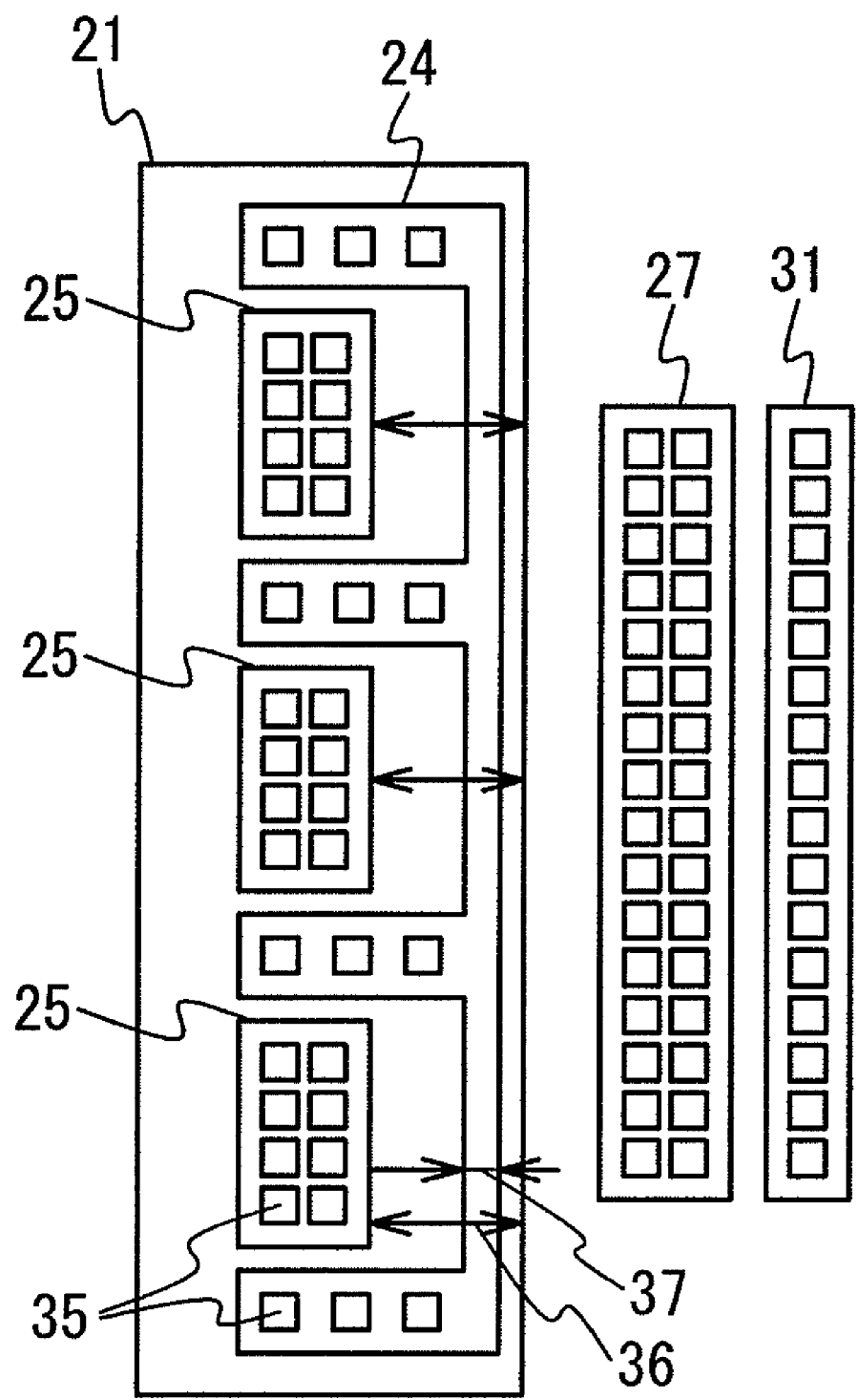
FIG. 33 is a plan view showing the layout of the ESD protection device of a fourteenth embodiment of the present invention.

Next, the ESD protection device according to the fourteenth embodiment of the present invention will be described. FIG. 33 is a plan view showing a layout of the ESD protection device of this embodiment. As shown in FIG. 33, the ESD protection device of this embodiment has the structure in which the N-well pick-up diffusion region is removed from the structure of the ESD protection device of the above-mentioned thirteenth embodiment. Otherwise, this embodiment is the same as the ESD protection device of the thirteenth embodiment. Thus, the area can be reduced.

Fifteenth Embodiment

Figure 34:
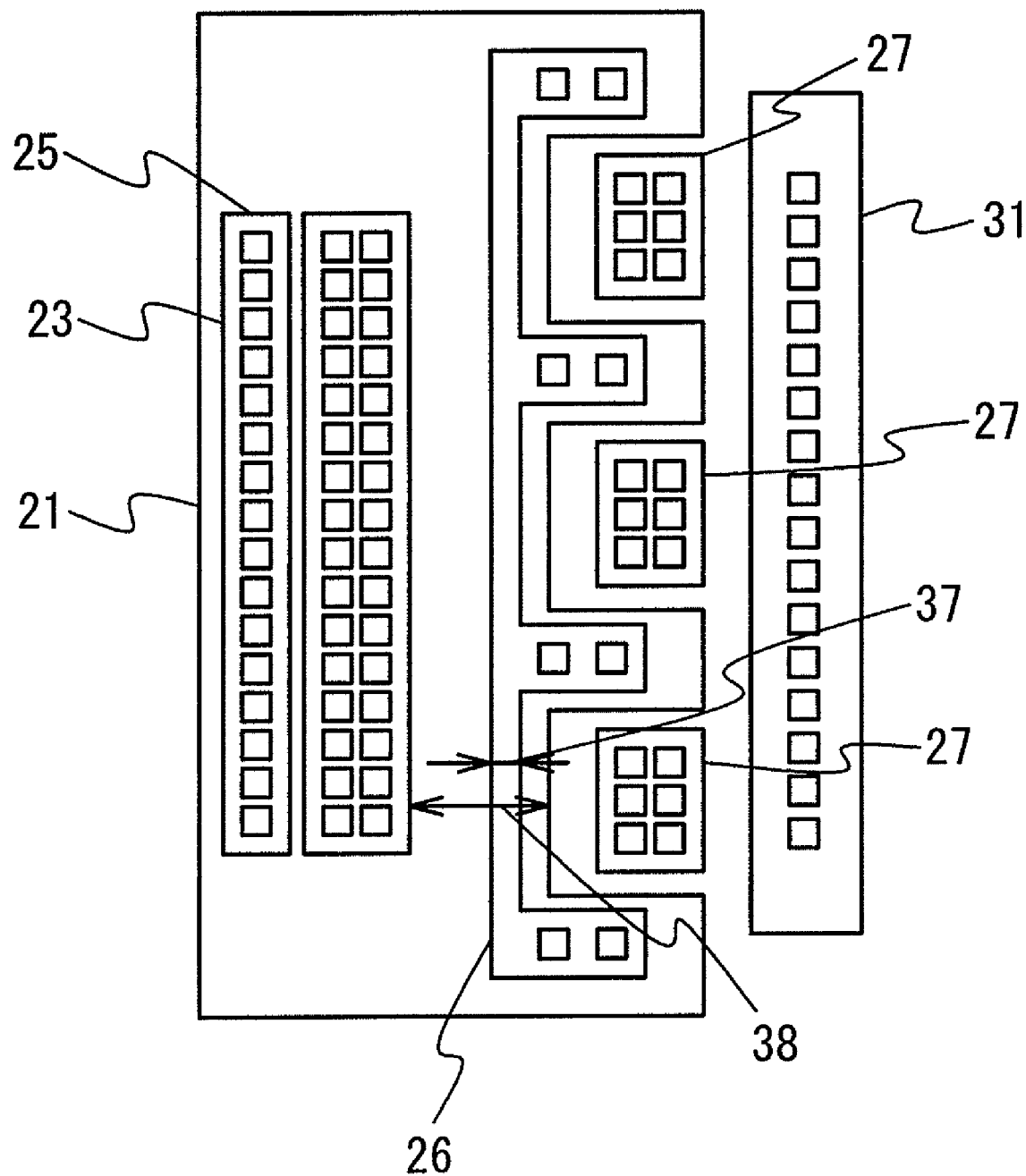
FIG. 34 is a plan view showing the layout of the ESD protection device of a fifteenth embodiment of the present invention.

Next, the ESD protection device according to the fifteenth embodiment of the present invention will be described. FIG. 34 is a plan view showing a layout of the ESD protection device of this embodiment. As shown in FIG. 34, the ESD protection device of this embodiment has the structure in which the contact forming area of the N-well pick-up diffusion region of the ESD protection device in the above-mentioned thirteenth embodiment is arranged between the separated cathodes. In this embodiment, the trigger electrode as a holding current control electrode is provided in the neighborhood of the cathode, and the electron current outputted from the cathode can be efficiently compared. Thus, the control performance (controllability or adjustability) of the holding current can be improved.

Sixteenth Embodiment

Figure 36:
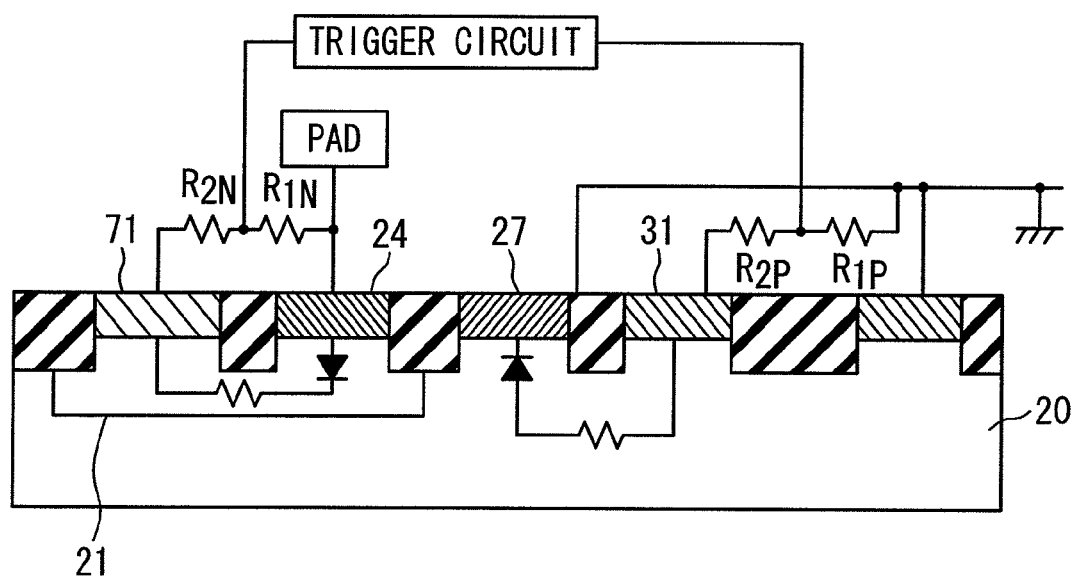
FIG. 36 is a cross sectional view showing the ESD protection device according to a sixteenth embodiment of the present invention.

Next, the ESD protection device according to the sixteenth embodiment of the present invention will be described. FIG. 36 is a cross sectional view showing the ESD protection device of this embodiment. Referring to FIG. 36, an anode and the triggering current supply N+ region, which is also used for the N-well potential control electrode, are formed in the N-well, and the cathode and the triggering current supply P+ region, which is also used for the P-well potential control electrode, are formed in the P-well. The triggering current supply diffusion layers are connected with the reference potential through the resistance elements. The triggering current is supplied from a midpoint of the resistance elements, and for example, the NMOS transistor is connected with both of triggering current supply terminals. Here, the resistance values of R1$n$ and R1$p$ are 2Ω, and the resistance values of R2$n$ and R2$p$ are set for the holding voltage to be set to a desired value. When the surge current flows, first, the NMOS transistor snaps back to supply the triggering current to each resistance element. Generally, because the well resistance of the SCR cannot be set so low, the most of the triggering current flows via the resistance elements. When the product of the resistance element value and the current value becomes approximately 1 V, each PN diode is biased in the forward direction. That is, the SCR in this embodiment is triggered by the V-PNP and the L-NPN simultaneously. If the triggering operations are not carried out at the same time, the excessive triggering current is required, as in the tenth conventional example. In this embodiment, the triggering operations are carried out at the same time, and since the structure for absorbing both of the hole current from the anode and the electron current from the cathode is not present in the SCR structure, the latch-up can be carried out at a moment. The triggering current is low, compared with the other embodiments and the holding voltage adjustable SCR of the conventional examples. In this embodiment, the triggering voltage is determined based on R$n$1 and R$p$1 and the holding voltage is determined based on a combination of R$n$1 and R$n$2 and a combination of R$p$1 and R$p$2. Therefore, the design easy. Consequently, it is effective in the easiness of the design that the operation parameter of the SCR can be easily set by the external resistance element. As described above, it should be noted that when separate triggering circuits are provided, the same effect as in this embodiment can be achieved, if these circuits are operated at the same time. Such a case is also contained in the present invention.

It should be noted that it is necessary to decrease the N-well resistance and the P-well resistance in the actual layout and it is possible to use the layout described in the eleventh conventional example for purpose of making the latching operation faster by narrowing the widths of the anode electrode and the cathode electrode.

Figure 37:
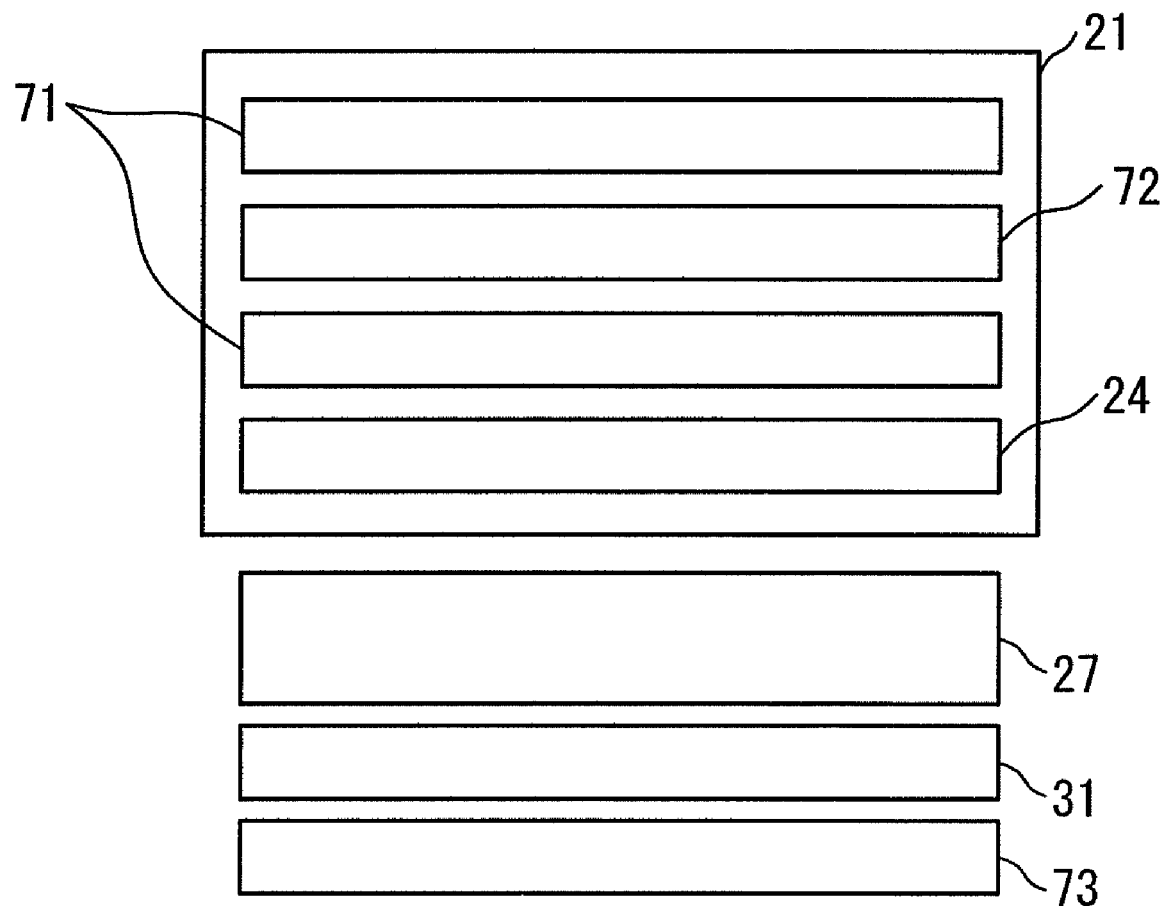
FIG. 37 is a plan view of another layout of the ESD protection device according to the sixteenth embodiment of the present invention.

As another layout, the trigger is assisted by arranging many PN diodes in the P-well in the neighborhood of the cathode, and many PN diodes in the N-well in the neighborhood of the anode, as shown in FIG. 37. In this way, because it is possible to decrease a diode resistance value, the adjustment of the external resistance becomes unnecessary and the trigger operation can be made faster. It should be noted that these additional diodes may be arranged only in the P-well.

Seventeenth Embodiment

Figure 38:
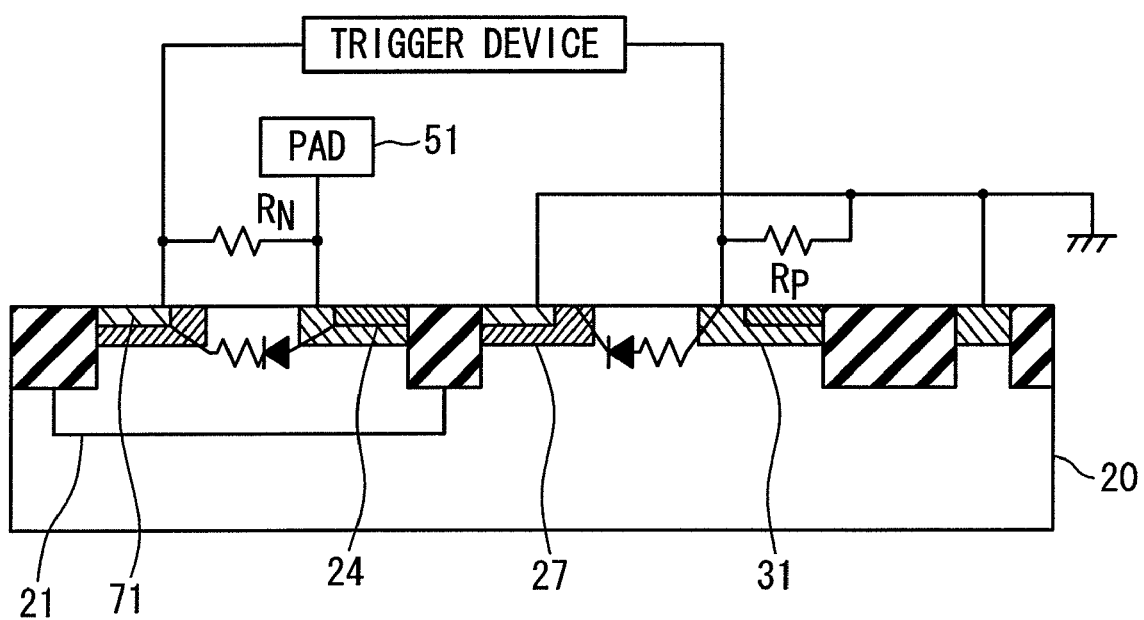
FIG. 38 is a cross sectional view showing the ESD protection device according to a seventeenth embodiment of the present invention.
Figure 39:
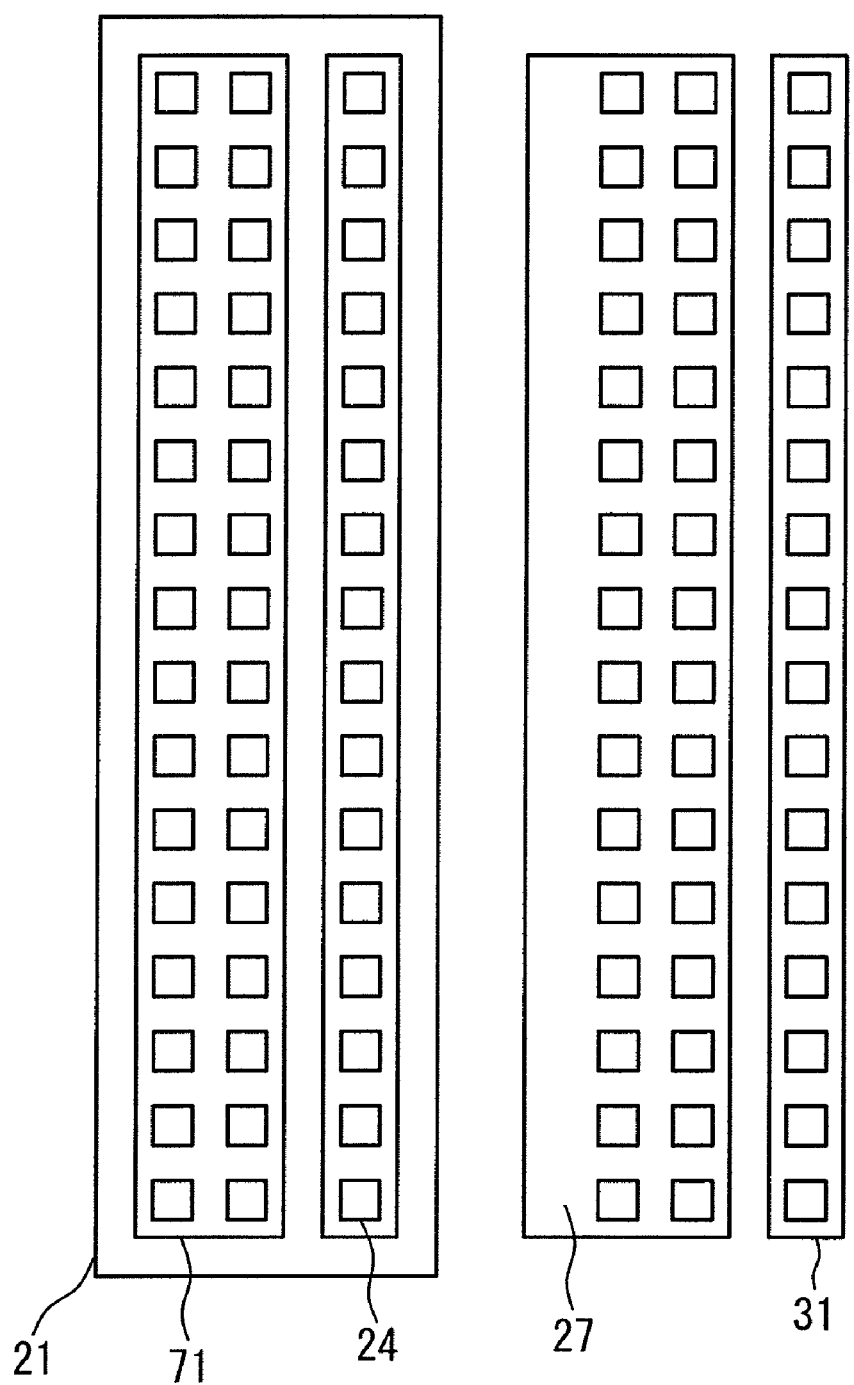
FIG. 39 is a plan view showing the layout of the ESD protection device according to a first modification of the twelfth embodiment of the present invention.
Figure 40:
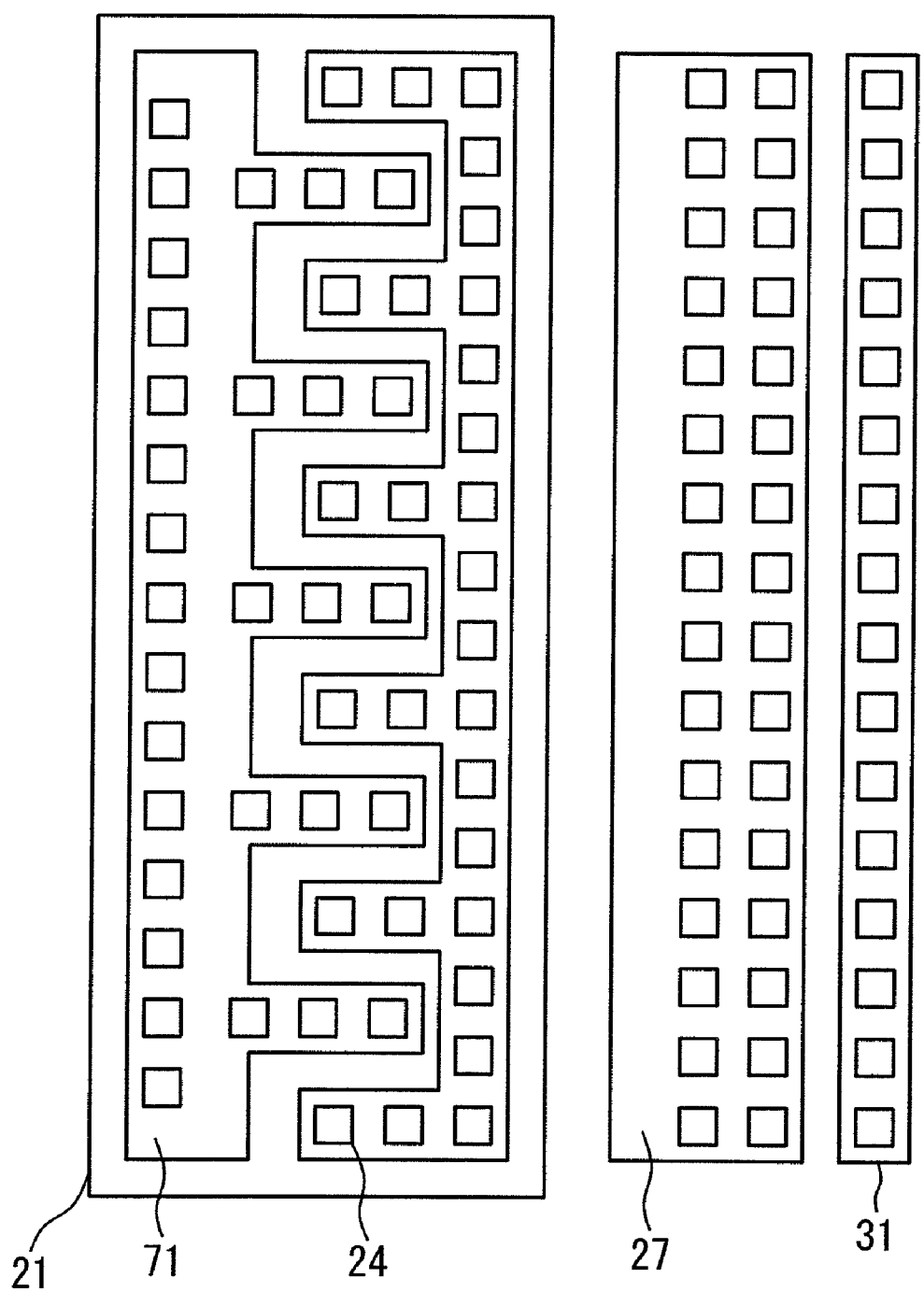
FIG. 40 is a plan view showing the layout of the ESD protection device according to a second modification of the twelfth embodiment of the present invention.

Next, the ESD protection device according to the seventeenth embodiment of the present invention will be described. FIG. 38 is a cross sectional view showing the ESD protection device of this embodiment. Referring to FIG. 38, a structure of a low resistance is used between the anode and the trigger N+ tap, (which also functions as the N-well voltage control region) and between the cathode and the trigger P+ tap (which also functions as the P-well voltage control region), as shown in FIGS. 30A and 30B. This resistance value can be made lower by one or more order than in the case of STI. Therefore, in order to increase the holding current of the SCR, it is necessary to set the external resistance to about 10 to 100Ω. However, because the resistance values of the diodes in the SCR structure are very low, most of the current flow through the diodes in case of the trigger operation. Therefore, even if the current flows from the trigger circuit to the two triggering current supply terminals, the rise of the clamp voltage can be made lower than in the example shown in FIG. 36. Also, because the current is not shunt, the trigger operation can be made faster and the triggering current can be made small.

According to the present invention, in the bipolar transistor of the SCR, the V-PNP transistor is set to the conductive state by supplying the current into the N-well, and the L-NPN transistor is set to the conductive state in response to the setting to the conductive state as the trigger. As a result, the SCR is set to a latch state. Thus, the SCR can be turned on at high speed. Also, in the holding voltage adjustable SCR, it is possible to prevent the excessive voltage increase when the triggering current flows into the N-well. It should be noted that the mos-like structure shown in FIG. 30B may be applicable for the device separation between the anode and the $N^+$ region and between the cathode and $P^+$ region.

What is claimed is:

1. An electro-static discharge protection circuit, comprising:
    a first bipolar transistor and a second bipolar transistor, said first and second bipolar transistors cooperating with one another to perform silicon controlled rectification; and
    a trigger device disposed apart from said first and second bipolar transistors;
    wherein one end of said trigger device is connected directly to a base region of said first bipolar transistor, and
    another end of said trigger device is connected directly to a base region of said second bipolar transistor.

2. The electro-static discharge protection circuit according to claim 1, further comprising a first resistance element,
    wherein said one end of said trigger device is connected to said base region of said first bipolar transistor via said first resistance element.

3. The electro-static discharge protection circuit according to claim 2, further comprising a second resistance element,
    wherein said another end of said trigger device is connected to a ground via said second resistance element.

4. The electro-static discharge protection circuit according to claim 1, wherein:
    an anode of said silicon controlled rectifier is connected to a pad, and
    a cathode of said silicon controlled rectifier is connected to a ground.

* * * * *